United States Patent
Lu et al.

(10) Patent No.: US 9,537,472 B2
(45) Date of Patent: Jan. 3, 2017

(54) INTEGRATED SWITCH AND SELF-ACTIVATING ADJUSTABLE POWER LIMITER

(71) Applicant: PEREGRINE SEMICONDUCTOR CORPORATION, San Diego, CA (US)

(72) Inventors: Jianhua Lu, San Diego, CA (US); Peter Bacon, Derry, NH (US); Naveen Yanduru, San Diego, CA (US); Edward Nicholas Comfoltey, San Diego, CA (US); Michael Conry, San Diego, CA (US); Chieh-Kai Yang, Poway, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 62 days.

(21) Appl. No.: 14/527,712

(22) Filed: Oct. 29, 2014

(65) Prior Publication Data

US 2015/0162901 A1    Jun. 11, 2015

Related U.S. Application Data

(63) Continuation-in-part of application No. 13/841,490, filed on Mar. 15, 2013, now Pat. No. 8,928,388.

(51) Int. Cl.
*H03K 5/08*     (2006.01)
*H03K 17/687*   (2006.01)
(Continued)

(52) U.S. Cl.
CPC .............. *H03K 5/08* (2013.01); *H03G 7/004* (2013.01); *H03G 7/06* (2013.01); *H03G 11/00* (2013.01);
(Continued)

(58) Field of Classification Search
CPC ...... H03K 5/08; H03K 17/302; H03K 17/687; H03G 11/00; H03G 7/004; H03G 7/06; Y10T 29/49105
(Continued)

(56) References Cited

U.S. PATENT DOCUMENTS 3,898,410 A    8/1975    Peters
3,987,356 A    10/1976   Steigerwald
(Continued)

FOREIGN PATENT DOCUMENTS

| JP | 2001209441 | 8/2001 |
|----|------------|--------|
| JP | 2013228244 | 11/2013 |
| WO | 2009108391 | 9/2009 |

OTHER PUBLICATIONS

Bacon, Peter, "High Frequency Absorptive Switch Architecture", filed in the USPTO on Oct. 29, 2014, U.S. Appl. No. 14/527,168, 38 pgs.
(Continued)

*Primary Examiner* — Kenneth B Wells
(74) *Attorney, Agent, or Firm* — Jaquez Land Greenhaus LLP; Martin J. Jaquez, Esq.; John Land, Esq.

(57) ABSTRACT

A fast response time, self-activating, adjustable threshold limiter including a limiting element LE, a first coupling element $CE_1$ electrically connected from a signal node of LE to a control input of LE, and a second coupling element $CE_2$ electrically connected from the control input of LE to a nominal node of LE. An initial bias (control) voltage is also supplied to the control input of LE to dynamically control the limiting threshold for the limiter. Embodiments include usage of self-activating adjustable power limiters in combination with series switch components in a switch circuit in lieu of conventional shunt switches.

34 Claims, 24 Drawing Sheets

(51) Int. Cl.
  *H03G 7/00* (2006.01)
  *H03G 7/06* (2006.01)
  *H03G 11/00* (2006.01)
  *H03K 17/30* (2006.01)

(52) U.S. Cl.
  CPC .......... *H03K 17/302* (2013.01); *H03K 17/687* (2013.01); *H03J 2200/10* (2013.01); *Y10T 29/49105* (2015.01)

(58) Field of Classification Search
  USPC ........................................................ 333/103
  See application file for complete search history.

(56) References Cited

U.S. PATENT DOCUMENTS

| | | | |
|---|---|---|---|
| 5,642,267 A | | 6/1997 | Brkovic et al. |
| 5,646,833 A | | 7/1997 | Gaudreau et al. |
| 5,777,530 A | * | 7/1998 | Nakatuka .................. H01P 1/15 333/104 |
| 5,883,541 A | * | 3/1999 | Tahara .................. H03K 17/693 327/434 |
| 6,201,714 B1 | | 3/2001 | Liang |
| 6,215,634 B1 | | 4/2001 | Terasawa |
| 6,229,355 B1 | | 5/2001 | Ogasawara |
| 6,489,755 B1 | | 12/2002 | Boudreaux et al. |
| 7,170,135 B2 | | 1/2007 | Zecri et al. |
| 7,307,490 B2 | * | 12/2007 | Kizuki .................. H03K 17/693 333/101 |
| 7,482,930 B2 | | 1/2009 | Song et al. |
| 7,619,462 B2 | * | 11/2009 | Kelly ...................... H04B 1/48 327/427 |
| 7,719,343 B2 | | 5/2010 | Burgener et al. |
| 7,847,655 B2 | * | 12/2010 | Otani ........................ H01P 1/15 333/101 |
| 7,910,993 B2 | | 3/2011 | Brindle et al. |
| 7,936,237 B2 | * | 5/2011 | Park ........................ H01P 1/213 333/101 |
| 8,081,928 B2 | * | 12/2011 | Kelly ................. H03K 17/6871 333/101 |
| 8,129,787 B2 | | 3/2012 | Brindle et al. |
| 8,320,091 B2 | | 11/2012 | Salcedo et al. |
| 8,405,147 B2 | | 3/2013 | Brindle et al. |
| 8,742,502 B2 | | 6/2014 | Brindle et al. |
| 8,928,388 B2 | | 1/2015 | Lu et al. |
| 9,490,647 B2 | | 11/2016 | Ju et al. |
| 2003/0021131 A1 | | 1/2003 | Nadot et al. |
| 2004/0090807 A1 | | 5/2004 | Youm |
| 2005/0023995 A1 | | 2/2005 | Ohnishi et al. |
| 2005/0248295 A1 | | 11/2005 | Chiou |
| 2006/0244393 A1 | | 11/2006 | Zane |
| 2009/0296431 A1 | | 12/2009 | Borisov |
| 2011/0031939 A1 | | 2/2011 | Funaba et al. |
| 2011/0043271 A1 | | 2/2011 | Ranta et al. |
| 2011/0058392 A1 | | 3/2011 | Lee et al. |
| 2011/0069513 A1 | | 3/2011 | Lee et al. |
| 2011/0156819 A1 | | 6/2011 | Kim et al. |
| 2011/0241424 A1 | | 10/2011 | Fan et al. |
| 2012/0038344 A1 | | 2/2012 | Kim et al. |
| 2012/0248946 A1 | | 10/2012 | Shaver et al. |
| 2012/0267719 A1 | | 10/2012 | Brindle et al. |
| 2014/0266383 A1 | | 9/2014 | Lu et al. |
| 2015/0002195 A1 | | 1/2015 | Englekirk |
| 2015/0002214 A1 | | 1/2015 | Englekirk |
| 2015/0372525 A1 | | 12/2015 | Ju et al. |

OTHER PUBLICATIONS

Drozdovski, Nikolai, "Microwave Passive Power Limiters Based on MESFETs", Journal of Microwaves and Optoelectronics, vol. 1, No. 2, Apr. 1998, pp. 26-36.

Wells, Kenneth B., Office Action received from the USPTO dated Apr. 30, 2014 for U.S. Appl. No. 13/841,490, 20 pgs.

Lu, et al., Response filed in the USPTO dated Jul. 30, 2014 for U.S. Appl. No. 13/841,490, 24 pgs.

Wells, Kenneth B., Notice of Allowance received from the USPTO dated Sep. 3, 2014 for U.S. Appl. No. 13/841,490, 8 pgs.

Lu, et al., Comments on Examiner's Statement of Reasons for Allowance filed in the USPTO dated Dec. 3, 2014 for U.S. Appl. No. 13/841,490, 3 pgs.

Kik, Phallaka, Office Action received from the USPTO dated Apr. 19, 2016 for U.S. Appl. No. 14/309,312, 8 pgs.

Ju, et al., Response filed in the USPTO dated May 26, 2016 for U.S. Appl. No. 14/309,312, 4 pgs.

Kik, Phallaka, Notice of Allowance received from the USPTO dated Jul. 6, 2016 for U.S. Appl. No. 14/309,312, 38 pgs.

* cited by examiner

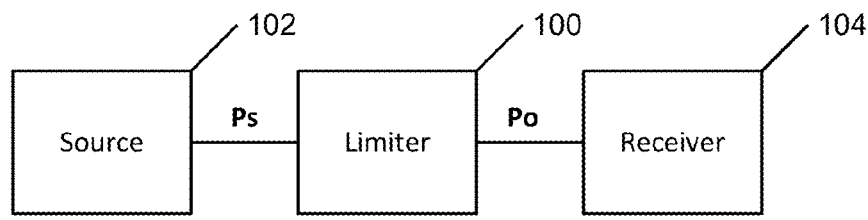
FIG. 1
(prior art)
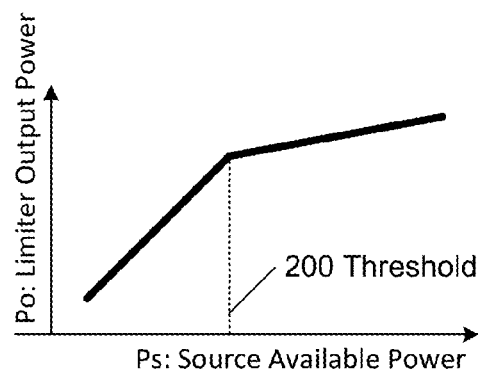
FIG. 2
(prior art)
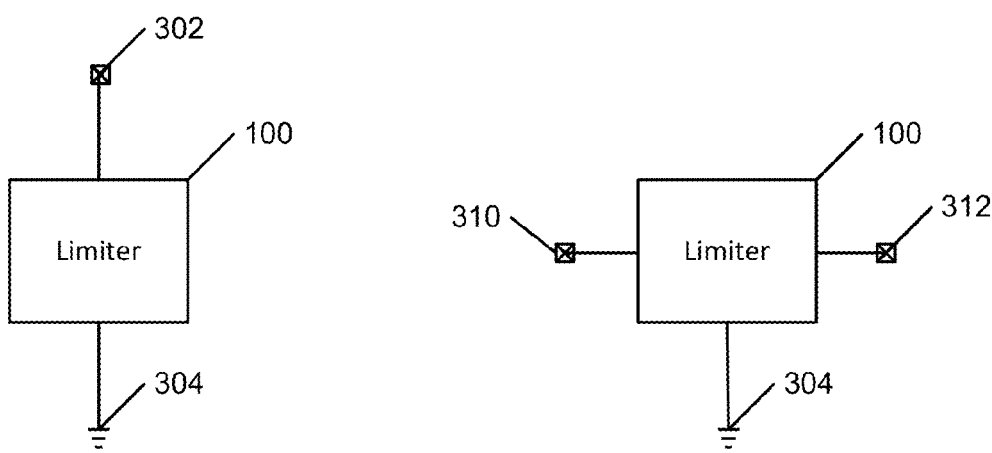
Limiter in 1-port network form
FIG. 3A
(prior art)
Limiter in 2-port network form
FIG. 3B
(prior art)

Shunt Switch Configuration

Series Switch Configuration

Front end of test Instruments with limiter

Limiter Protecting a Receiver
(in 2-port network form)

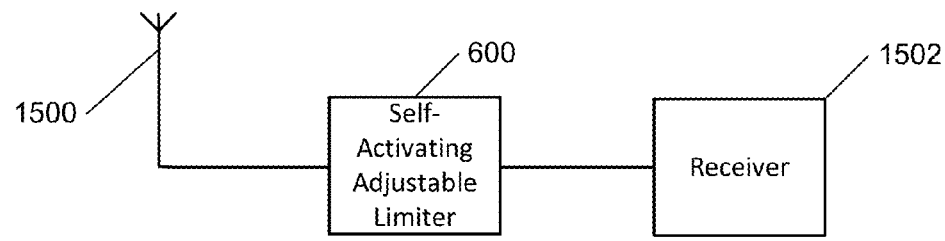
Limiter Protecting a Wireless Receiver
FIG. 15
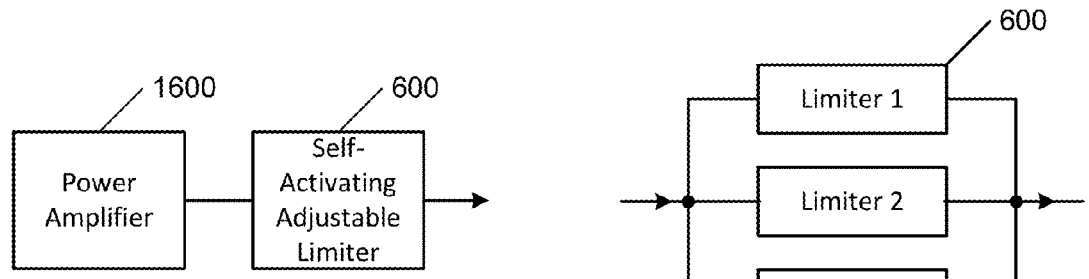
FIG. 16
FIG. 17
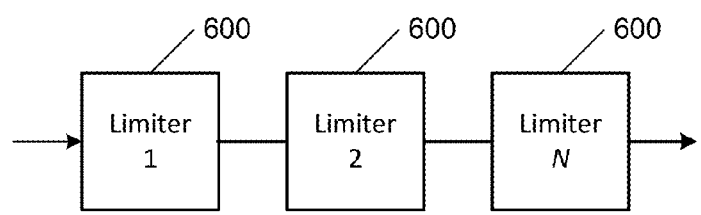
FIG. 18

Limiter Protecting Digital-tuned-Capacitor in single-ended form

Limiter Protecting Digital-tuned-Capacitor in differential form

INTEGRATED SWITCH AND SELF-ACTIVATING ADJUSTABLE POWER LIMITER

CROSS-REFERENCE TO RELATED APPLICATIONS

The present application is a Continuation-In-Part (CIP) of, and claims priority to, commonly assigned U.S. patent application Ser. No. 13/841,490, entitled "Self-Activating Adjustable Power Limiter", filed on Mar. 15, 2013, and issued as U.S. Pat. No. 8,928,388, the entire disclosure of which is incorporated herein by reference.

BACKGROUND (1) Technical Field

This invention relates to electronic circuitry, and more particularly to a self-activating adjustable threshold power limiter circuit.

(2) Background

Limiter circuits are used in electronic systems to limit power, voltage, or current to protect electrically connected "downstream" electronic devices from being damaged by excessive power, voltage, or current from a source, which may be an "upstream" power source, signal source, antenna, device being tested, etc. For example, FIG. 1 is a block diagram of a prior art limiter 100 electrically connected to limit the power Ps from a source 102 delivered to a receiver 104 so as not to exceed a set output power level Po. FIG. 2 is a graph showing a typical Ps-Po characteristic curve of the limiter of FIG. 1. At normal signal levels, the output Po of the limiter 100 linearly tracks the input Ps from the source 102. However, at a designed threshold signal point 200, the output Po of the limiter 100 is significantly curtailed as the input Ps value increases above the threshold signal point 200.

Limiters can be electrically connected to other circuitry in a variety of ways. For example, FIG. 3A is a block diagram showing a 1-port network form of a prior art limiter 100 having an input connection 302 and a circuit ground connection 304. FIG. 3B is a block diagram showing a 2-port network form of a prior art limiter 100 having an input connection 310, an output connection 312, and a circuit ground connection 304. Alternatively, instead of being grounded, node 304 can simply be connected to a different circuit path for power transfer.

A number of different circuit configurations have been used as limiters. FIG. 4 is a circuit diagram of a prior art limiter 100 comprising two back-to-back diodes 400 (typically PIN diodes or Schottky diodes), shown electrically coupled to a signal line between a source 402 and a receiver 404. This type of circuit does not allow for an adjustable limiting threshold and has poor linearity. Further, fast PIN diodes are not available in certain semiconductor implementation processes, such as standard bulk silicon, silicon-on-insulator (SOI), and silicon-on-sapphire (SOS) processes, and thus are not available for integration with other circuitry.

FIG. 5A is a circuit diagram of a prior art limiter 100 comprising a power/amplitude detector 500 electrically coupled to the gate node of a field effect transistor (e.g., a MOSFET) 502 configure as a switchable shunt element. The detector 500 monitors the voltage amplitude or power of a signal line 506 from a source 508 to a receiver 510. If the power/amplitude exceeds a set threshold, the detector 500 applies a control voltage to switch on the transistor 502, which is electrically coupled between the signal line 506 and circuit ground. When the transistor 502 is switched to "on", the signal line 506 is shunted to ground, thus limiting the signal applied to the input of the receiver 510.

FIG. 5B is a circuit diagram of a prior art limiter 100 comprising a power/amplitude detector 500 electrically coupled to the gate node of a field effect transistor (e.g., a MOSFET) 504 configured as a single-pole single-throw switch. The detector 500 monitors the voltage amplitude or power of a signal line 506 from a source 508 to a receiver 510. If the power/amplitude exceeds a set threshold, the detector 500 applies a control voltage to switch off the transistor 504, which is electrically coupled in series with the signal line 506. When the transistor 504 is switched off, the signal line 506 is forced to a non-conductive state, thus decoupling the source 508 from the receiver 510 and thereby cutting off the signal applied to the input of the receiver 510.

The power/amplitude detector types of limiter circuits have a relatively long response time constrained by the detector implementation, which restricts their use in applications that demand an effectively instant limiting effect.

Accordingly, there is a need for a limiter having a fast response time, good linearity, and an adjustable limiting threshold. It would also be quite useful if such a limiter could be configured to handle high power, and was easy to fabricate and to integrate with other circuitry. These and other advantages are achieved by the present invention.

SUMMARY OF THE INVENTION

A self-activating, adjustable threshold limiter in accordance with the present invention includes a limiting element LE. A first coupling element $CE_1$ is electrically connected from a signal node of LE to a control input of LE. A second coupling element $CE_2$ is electrically connected from the control input of LE to a second signal node of LE (nominally an output node). An initial bias (control) voltage Vctrl is also supplied to the control input of LE to set the limiting threshold for the limiter.

The limiting element LE is preferably a voltage controlled element that shows a high degree of isolation between input and output, has an essentially non-conducting ("off") state if the voltage at the control input is less than a set value, has a "variable impedance" or "controlled impedance" state in which it behaves as a voltage controlled current source in response to application of a selected range of voltage values on the control input, and, for some embodiments, can be switched by application of a relatively large voltage value on the control input to a fully conductive "on" state (triode mode) where it behaves as a low-value impedance.

Both coupling elements $CE_1$ and $CE_2$ have the characteristic that they substantially block any direct current (DC) component of a signal applied to either of their respective connection terminals but allow any alternating current (AC) component of the signal to pass through to their other respective connection terminals.

As an example of usage of the self-activating adjustable threshold limiter, the limiter is electrically coupled in a shunting configuration to a signal line from a source to a receiver. The signal node of LE is electrically coupled to the signal line, while the output of LE is electrically coupled to a circuit path for power transfer, in this example, circuit ground. If the voltage at the control input is less than a set value corresponding to the "off" or essentially non-conducting state of LE, then no current is shunted through LE to circuit ground and LE has essentially no effect on a signal propagating from the source to the receiver over the signal line. However, if the voltage at the control input has a value corresponding to the "controlled impedance" state of LE, the signal line is partially shunted through LE to circuit ground, essentially limiting the signal on signal line from fully propagating from the source to the receiver.

The limiting element LE may be implemented as a field effect transistor $M_1$, with the control input of LE corresponding to the gate node of $M_1$, a first node of LE corresponding to either the source or drain of $M_1$, and a second node of LE corresponding to the drain or source (i.e., the opposite of the input node) of $M_1$. Further, both coupling elements $CE_1$ and $CE_2$ may be readily implemented as capacitors, in which capacitor $C_1$ corresponds to $CE_1$, and capacitor $C_2$ corresponds to $CE_2$. Using standard FET fabrication techniques, both $C_1$ and $C_2$ may be implemented as intrinsic source-to-gate and drain-to-gate capacitances by adjusting device geometry and fabrication parameters, in known fashion. Alternatively, separate integrated capacitor structures or externally supplied discrete capacitors may be used as desired.

Because of the nature of the coupling elements $CE_1$, $CE_2$, a limiter circuit in accordance with the present invention is self-activating and can be turned into limiting mode essentially instantly when an applied signal on the signal line, to which LE is connected, causes the voltage at the control input (the gate node, for a FET) to exceed a set level. Therefore, such a limiter's response time is much faster than prior art power/voltage detector circuits.

A notable advantage of the inventive limiter is that the threshold voltage of the limiter is adjustable by setting various values for the control voltage Vctrl. In addition, a limiter in accordance with the present invention can be "tuned" by an appropriate choice of design parameters during fabrication.

The linearity of a FET implementation of the limiter of the present invention can be improved by providing a means for sweeping out accumulated charge trapped below the gate oxide of transistor $M_1$, such as by use of the "HaRP"™ accumulated charge sink (ACS) technology taught in U.S. Pat. No. 7,910,993, assigned to the assignee of the present invention and incorporated herein by this reference.

In addition, by using a technology in which individual FETs can be sufficiently isolated from each other to enable stacking and voltage division, two or more of the limiter elements LE in accordance with the present invention, or multiple $M_1$ field effect devices within a single limiter element, may be stacked. Such stacking allows fine tuning of desired limiting characteristics.

A self-activating adjustable threshold power limiter circuit in accordance with the present invention allows a number of functions not known in or generally difficult to implement in the prior art.

Embodiments include usage of self-activating adjustable power limiters in combination with series switch components in a switch circuit in lieu of conventional shunt switches.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 1 is a block diagram of a prior art limiter electrically connected to limit the power Ps from a source delivered to a receiver so as not to exceed a set output power level Po.

FIG. 2 is a graph showing a typical limiter Ps-Po characteristic curve for the prior art limiter of FIG. 1.

FIG. 3A is a block diagram showing a 1-port network form of a prior art limiter.

FIG. 3B is a block diagram showing a 2-port network form of a prior art limiter.

FIG. 15 is a block diagram showing a self-activating adjustable limiter electrically coupled between an antenna and a wireless receiver.

FIG. 16 is a block diagram showing a self-activating adjustable limiter electrically coupled to the output of a power amplifier.

FIG. 17 is a block diagram showing N self-activating adjustable limiters electrically coupled in parallel.

FIG. 18 is a block diagram showing N self-activating adjustable limiters electrically coupled in series.

Like reference numbers and designations in the various drawings indicate like elements.

DETAILED DESCRIPTION OF THE INVENTION

Figure 6A:
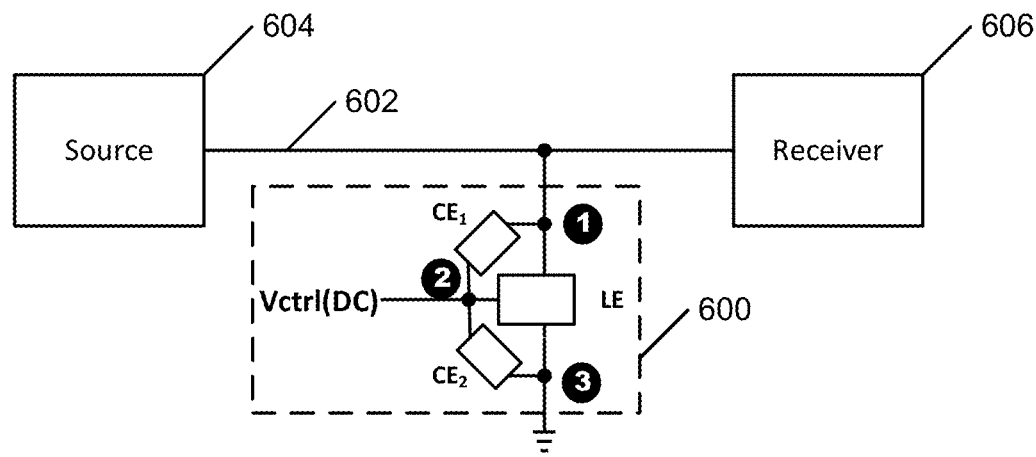
FIG. 6A is a circuit diagram of a generalized embodiment of the self-activating adjustable power limiter of the invention.

FIG. 6A is a circuit diagram of a generalized embodiment of the invention. A self-activating, adjustable threshold limiter 600 in accordance with the present invention includes a limiting element LE. A first coupling element $CE_1$ is electrically connected from a signal node 1 of LE to a control input 2 of LE. A second coupling element $CE_2$ is electrically connected from the control input 2 of LE to a second signal node 3 of LE (nominally an output node). An initial bias (control) voltage Vctrl is also supplied to the control input 2 of LE to set the limiting threshold for the limiter 600.

The limiting element LE is preferably a voltage controlled element that shows a high degree of isolation between input and output, has an essentially non-conducting ("off") state if the voltage at the control input 2 is less than a set value, has a "variable impedance" or "controlled impedance" state in which it behaves as a voltage controlled current source in response to application of a selected range of voltage values on the control input 2, and, for some embodiments, can be switched by application of a relatively large positive (with respect to Vth for LE) voltage value on the control input 2 to a fully conductive "on" state (triode mode) where it behaves as a low-value impedance and stays in this mode of operation regardless of the AC signal amplitude presented on its other terminals.

Both coupling elements $CE_1$ and $CE_2$ have the characteristic that they substantially block any direct current (DC) component of a signal applied to either of their respective connection terminals but allow any alternating current (AC) component of the signal to pass through to their other respective connection terminals, although possibly with some change in amplitude, phase, time delay, or other deviation from the applied signal.

As an example of usage of the self-activating adjustable limiter 600 of FIG. 6A, the limiter 600 is shown electrically coupled in a shunting configuration to a signal line 602 from a source 604 to a receiver 606 (where "receiver" includes any electrical circuitry for which voltage limiting protection is desirable). In particular, in this example, node 1 of LE is electrically coupled to the signal line 602, while node 3 of LE is electrically coupled to a circuit path for power transfer (shown as circuit ground in this example). If the voltage at the control input 2 is less than a set value corresponding to the "off" or essentially non-conducting state of LE, then no current is shunted through LE to circuit ground and LE has essentially no effect on a signal propagating from the source 604 to the receiver 606 over the signal line 602. However, if the voltage at the control input 2 has a value corresponding to the "on" or conducting state of LE, the signal line 602 is partially shunted through LE to circuit ground, essentially limiting the signal on signal line 602 from fully propagating from the source 604 to the receiver 606.

Figure 6B:
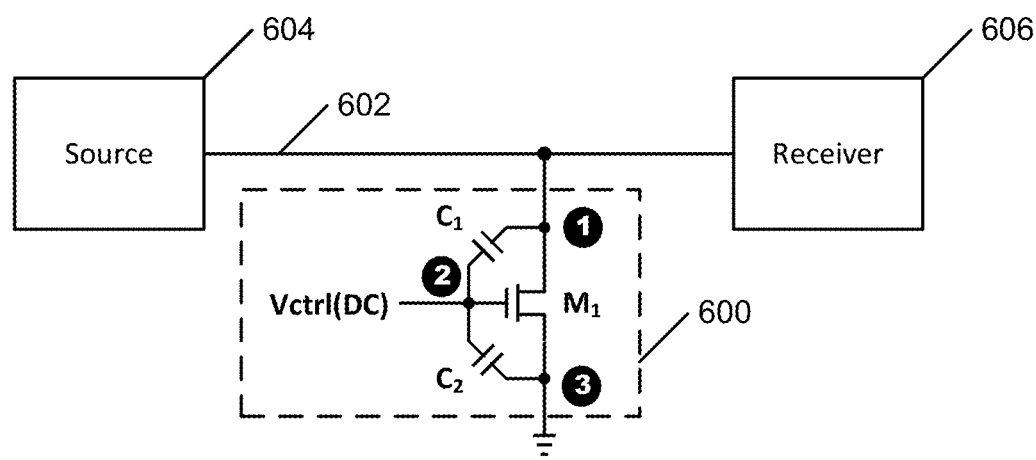
FIG. 6B is a circuit diagram of an embodiment of the invention utilizing capacitors as coupling elements.

As shown in FIG. 6B, limiting element LE may be implemented as a field effect transistor $M_1$, with the control input 2 of LE corresponding to the gate node of $M_1$, a node 1 corresponding to the source or drain of $M_1$, and a node 3 corresponding to the drain or source (i.e., opposite of node 1) of $M_1$. As will be appreciated by a practitioner in the art, the status of node 1 or node 3 as a source or drain for $M_1$ depends on the condition of an applied signal. Transistor $M_1$ may be, for example, an NMOS or PMOS type field effect transistor (FET). Further, both coupling elements $CE_1$ and $CE_2$ may be readily implemented as capacitors, in which capacitor $C_1$ corresponds to $CE_1$, and capacitor $C_2$ corresponds to $CE_2$. Using standard FET fabrication techniques, both $C_1$ and $C_2$ may be implemented as intrinsic source-to-gate and drain-to-gate capacitances by adjusting device geometry and fabrication parameters, in known fashion. Alternatively, separate integrated capacitor structures or externally supplied discrete capacitors may be used as desired.

When using a FET transistor $M_1$ for the limiting element LE, the operational states of LE correspond to the "off", "controlled variable impedance," and the "off" states of the transistor. When the voltage at node 2 is small, $M_1$ has a high impedance and restricts current flow. When the voltage at node 2 approaches the threshold voltage of $M_1$, the impedance of $M_1$ decreases with increasing control voltage, and $M_1$ behaves as a voltage controlled current source. When the voltage at node 2 is large enough (which only occurs when the control voltage is purposely set to a high value), $M_1$ becomes fully conductive (i.e., in triode mode) and enters the "on" state and presents a small impedance to current flow.

For illustration purposes only in the following discussion, $M_1$ will be treated as an NMOS type FET, and the coupling elements $CE_1$ and $CE_2$ will treated as having been implemented as capacitors. As is known in the art, the various control and bias voltages discussed below may have to be reversed in polarity when using a PMOS type FET transistor for $M_1$.

Figure 7A:
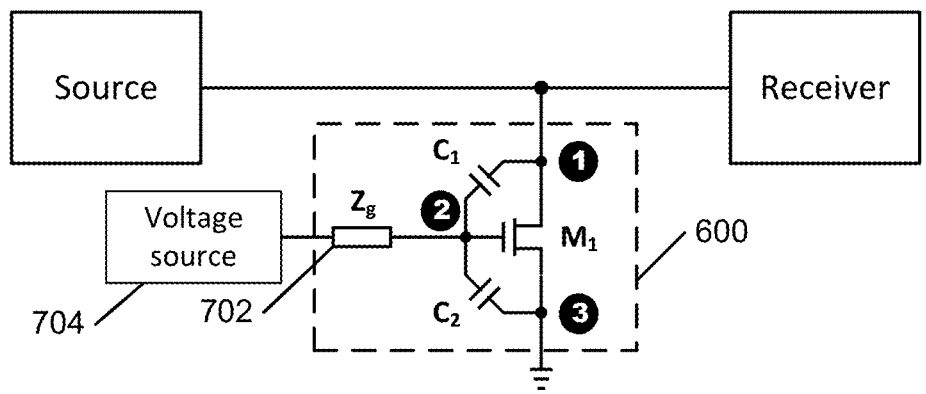
FIG. 7A is a circuit diagram showing a high impedance component used to provide a bias voltage for the self-activating adjustable limiter of the invention.
Figure 7B:
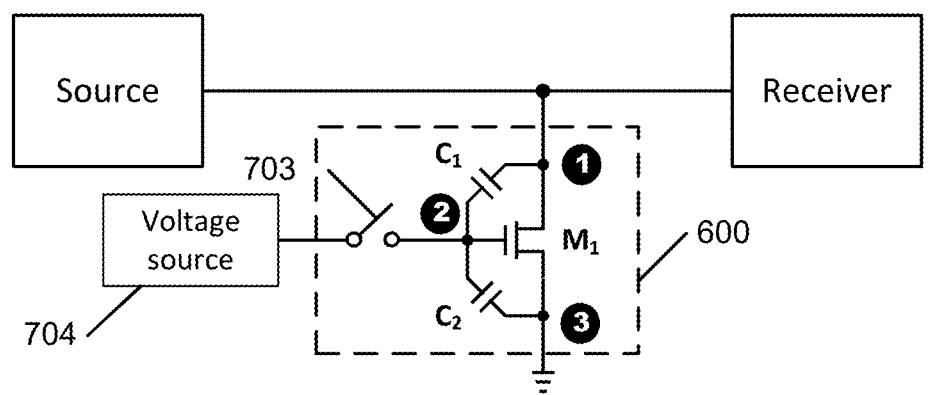
FIG. 7B is a circuit diagram showing a switch used to provide a bias voltage for the self-activating adjustable limiter of the invention.

In the illustrated embodiments, the bias voltage Vctrl can be provided in various ways. For example, FIG. 7A is a circuit diagram showing a high impedance component 702 (such as a resistor or an inductor or combination of the two) electrically coupled between the gate node 2 of transistor $M_1$ and a DC voltage source 704. FIG. 7B is a circuit diagram showing a switch 704 that electrically connects the gate node 2 of $M_1$ to a DC voltage source 704 for a time, and then later disconnects the voltage source 704, thereby creating a floating bias voltage for the gate of $M_1$.

In practice, the impedance Zg 702 of the gate node 2 of $M_1$ is set much larger than the impedance of $C_1$ or $C_2$ for any frequency range of interest (e.g., DC to terahertz). Therefore, the signal amplitude at the gate node 2 (Vamp_2, measured from node 3 to node 2 in FIG. 6A) is proportional to the signal amplitude at node 1 of $M_1$ (Vamp_1, measured from node 3 to node 1 in FIG. 6A) multiplied by the ratio $C_1/(C_1+C_2)$; in particular, Vamp_2=Vctrl+($C_1/(C_1+C_2)$)*Vamp_1.

A first order estimate of the threshold voltage of the limiter 600, Vth_lim, is (($C_1+C_2)/C_1$)*(Vth−Vctrl), where Vth is the threshold voltage of $M_1$ and Vctrl is a negative voltage with respect to Vth when using NMOS for $M_1$ (Vctrl would be positive with respect to Vth when using PMOS for $M_1$).

Figure 8:
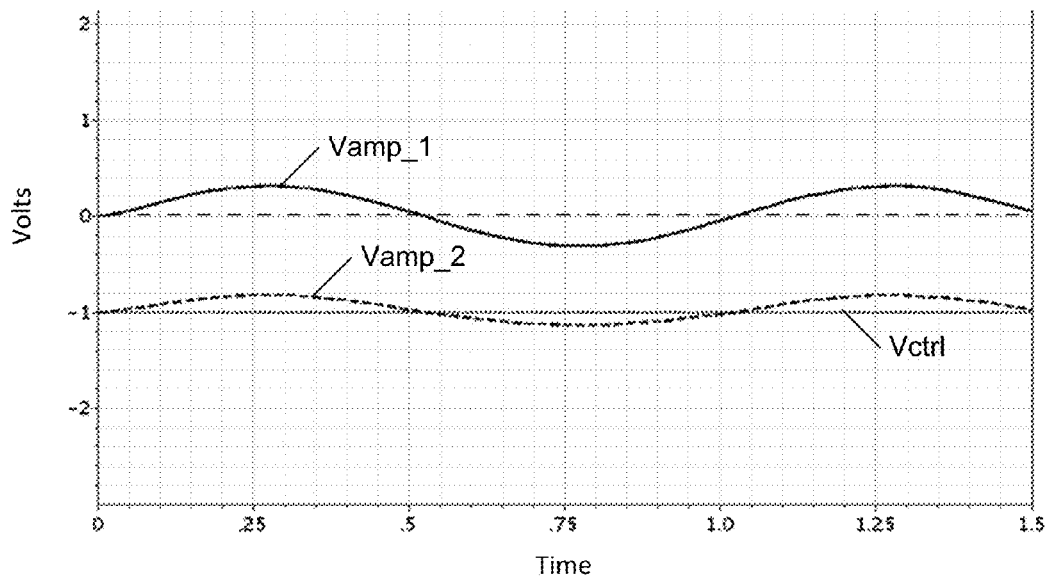
FIG. 8 is a diagram of simulated transient waveforms versus time for a limiter in accordance with the embodiment shown in FIG. 6B, when an input signal voltage amplitude is less than the threshold voltage of a self-activating adjustable limiter.

FIG. 8 is a diagram of simulated transient waveforms versus time for a limiter in accordance with the embodiment shown in FIG. 6B as applied to limit signal voltage on the signal line 602, as an example. FIG. 8 shows voltage (vertical scale) over time for a sinusoidal voltage amplitude Vamp_1 at node 1 of $M_1$ that is less than the threshold voltage of the limiter, Vth_lim. In this example, Vctrl at gate node 2 is −1 volt, node 3 of $M_1$ is at zero volts (i.e., at circuit ground, in this example), and node 1 of $M_1$ tracks the signal voltage amplitude output by the source 604. The total voltage Vamp_2 applied at the gate node 2 of $M_1$ is Vctrl plus a fraction of the voltage amplitude Vamp_1 applied at node 1, in accordance with the formula given above. Vamp_2 is shown in FIG. 8 as a dashed line waveform that linearly tracks the solid line waveform of the input signal Vamp_1. In this example, the gate-to-source voltage Vgs of $M_1$ is smaller than Vth (which, in this example, happens to be zero), therefore $M_1$ is off (non-conducting) and does not provide any limiting effect.

Figure 9:
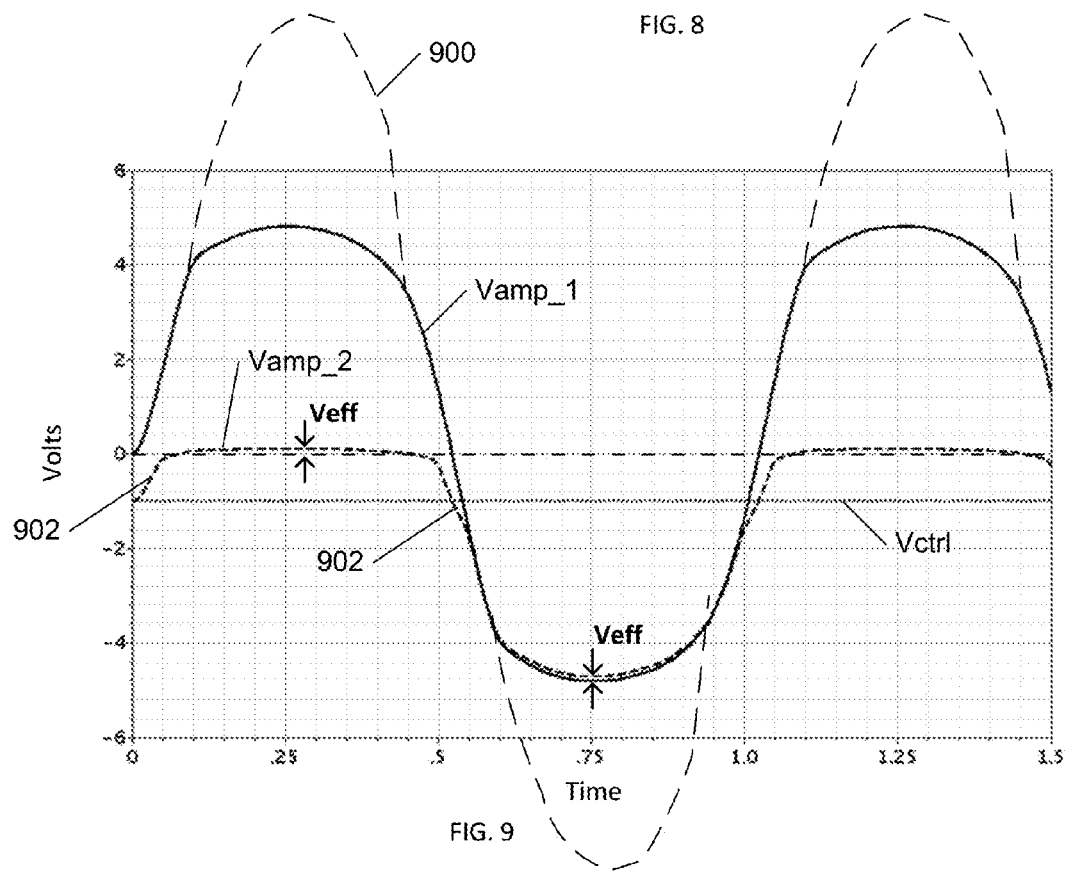
FIG. 9 is a diagram of simulated transient waveforms versus time for a limiter in accordance with the embodiment shown in FIG. 6B, where an input signal voltage amplitude at times is at or greater than the threshold voltage of a self-activating adjustable limiter.

FIG. 9 is a diagram of simulated transient waveforms versus time for a limiter in accordance with the embodiment shown in FIG. 6B as applied to limit signal voltage on the signal line 602, as an example. FIG. 9 shows voltage (vertical scale) over time for a sinusoidal voltage amplitude Vamp_1 at node 1 of $M_1$ that at times is at or greater than the threshold voltage of the limiter, Vth_lim. In this example, a dashed line 900 shows the nominal output signal that the source 604 would output if the limiter 600 was not in the circuit. However, with the limiter triggered, Vctrl at gate node 2 is −1 volt, node 3 of $M_1$ is at zero volts (i.e., at circuit ground, in this example), and node 1 of $M_1$ is limited to a lower signal voltage amplitude than the nominal output of the source 604 (note that the vertical scale in FIG. 9 is compressed compared to FIG. 8). As before, the total voltage Vamp_2 applied at the gate node 2 of $M_1$ is Vctrl plus a fraction of the voltage amplitude Vamp_1 applied at node 1, in accordance with the formula given above. Vamp_2 is shown in FIG. 9 as a dashed line waveform that no longer completely tracks the solid line waveform of the input signal Vamp_1. In this example, while the gate-to-source voltage Vgs of $M_1$ is smaller than Vth, $M_1$ is off (non-conducting) and does not provide any limiting effect, and accordingly Vamp_2 linearly tracks Vamp_1, as shown in regions 902. When Vgs equals or exceeds Vth, $M_1$ is on (conducting) and starts to divert current from the signal line 602 to ground, thus providing a limiting effect and reducing the actual power or voltage received by the receiver 606 from the source 604. Accordingly, the curve representing Vamp_1 is limited (clipped) in amplitude compared to the nominal output signal 900 of the source 604.

The limiting portion of the cycle shown in FIG. 9 occurs when Vgs equals or exceeds Vth. Another way of expressing this is to define an effective voltage, Veff=Vgs−Vth. When Veff is positive, the limiting function is engaged; when Veff is negative, the limiting function is disengaged. During the positive portion of the nominal output signal waveform 900, node 3 of $M_1$ is the source node for transistor $M_1$ and node 1 is the drain node, hence Vgs is measured as the voltage between node 2 and node 3 of $M_1$. Accordingly, in the illustrated example, since Vth=0 volts and Vctrl=−1, Veff is positive whenever the applied signal absolute voltage value between node 2 and node 3 (which is the combination of Vctrl and the input signal coupled from node 1) of $M_1$ is greater than or equal to the threshold voltage Vth of $M_1$.

However, during the negative portion of the nominal output signal waveform 2000, node 1 of $M_1$ is the source node for transistor $M_1$ and node 3 is the drain, hence Vgs is measured as the voltage between node 2 and node 1 of $M_1$. Accordingly, in the illustrated example, since Vth=0 volts and Vctrl=−1, Veff is positive whenever the applied signal voltage between node 2 and node 1 of $M_1$ is greater than or equal to the threshold voltage Vth of $M_1$.

It should be appreciated that an actual diagram of a variable input signal versus time will be a combination of the diagrams shown in FIGS. 8 and 9. Also notable is that the limiting effect happens equally well at both positive and negative excursions of the source signal when $CE_1$ equals $CE_2$ (or, similarly, when $C_1$ equals $C_2$), as shown in FIG. 9, and thus the output signal has a symmetrical amplitude.

Figure 5A:
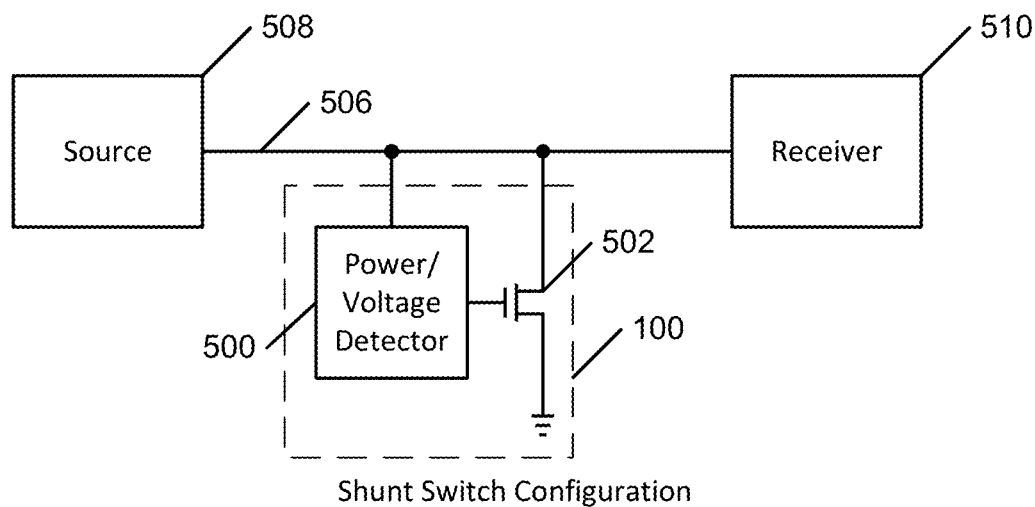
FIG. 5A is a circuit diagram of a prior art limiter comprising a power/amplitude detector electrically coupled to the gate node of a field effect transistor in a shunt configuration.
Figure 5B:
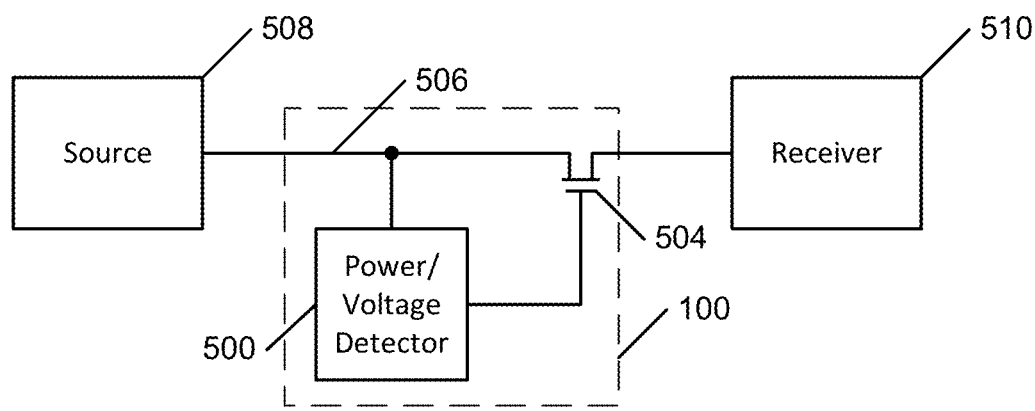
FIG. 5B is a circuit diagram of a prior art limiter comprising a power/amplitude detector electrically coupled to the gate node of a field effect transistor in a switched signal configuration.

Because of the nature of the coupling elements $CE_1$, $CE_2$ shown in FIG. 6A (shown as capacitors in FIG. 6B), a limiter circuit in accordance with the present invention can be turned into limiting mode essentially instantly when an applied signal on the signal line, to which LE is connected, causes the voltage at the control input (the gate node, for a FET) to exceed a set level; the speed of response is limited only by the cut-off frequency, $f_t$, of the FET $M_1$ so long as the CE*Zg time constant (½*pi*freq) point is set long enough. Therefore, such a limiter's response time is much faster than the prior art power/voltage detector circuits shown in FIGS. 5A and 5B.

Figure 10:
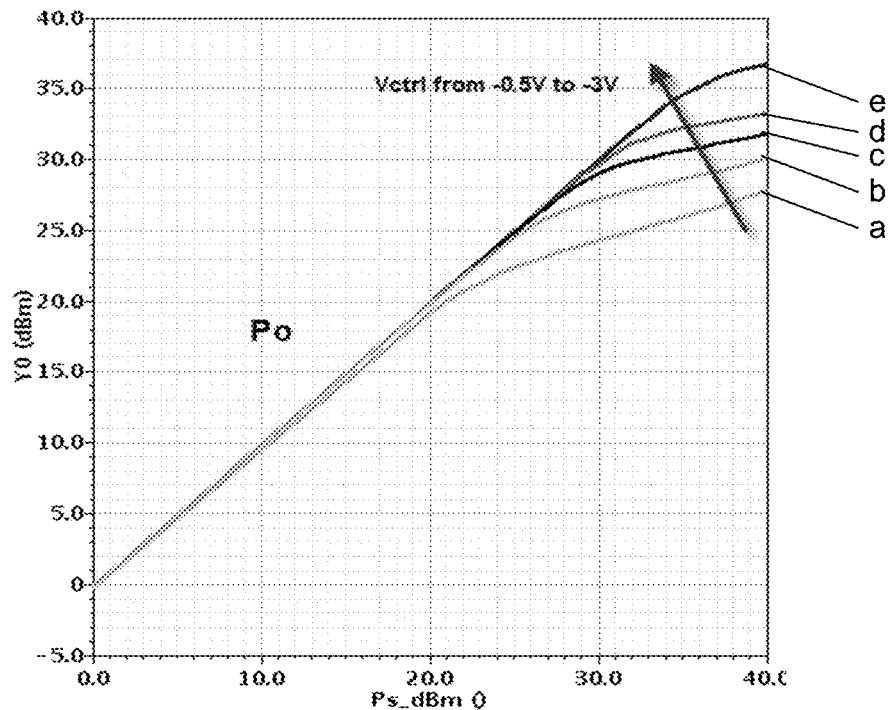
FIG. 10 is a graph showing simulated values of Po versus Ps at different Vctrl values for one embodiment of the invention.

A notable advantage of the inventive limiter is that the threshold voltage of the limiter, Vth_lim, is adjustable by setting various values for the control voltage Vctrl. For example, FIG. 10 is a diagram showing simulated values of Po versus Ps at different Vctrl values for one embodiment of the invention (where Vctrl for the labeled curves are: a=−0.5V; b=−1V, c=−1.75V, d=−2.5V, e=−3V). More negative Vctrl values give a higher limiter threshold point.

In addition to controlling the threshold voltage of the limiter, Vth_lim, by setting different values for Vctrl, in a FET implementation of the invention in a given technology, the slope of Po/Ps (in the limiting region) in FIG. 10 is determined by the width to length (W/L) geometry of the FET structure, where W is the gate width and L is the gate length: a larger W/L ratio of the FET results in a flatter Po/Ps slope. Accordingly, a limiter in accordance with the present invention can be "tuned" by an appropriate choice of FET design parameters during fabrication.

The circuit shown in FIG. 6B can be enhanced in a number of ways using particular fabrication technologies and circuit techniques. For example, the linearity of a FET implementation of the limiter of the present invention can be improved by providing a means for sweeping out accumulated charge trapped below the gate oxide (by attraction to the gate bias Vctrl) of transistor $M_1$. This may be done, for example, using the "HaRP"™ accumulated charge sink (ACS) technology taught in U.S. Pat. No. 7,910,993, assigned to the assignee of the present invention and incorporated herein by this reference. A further discussion of FET's made in accordance with such accumulated charge sink (ACS) technology is set forth in greater detail below.

Figure 11A:
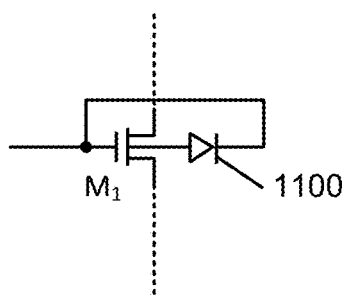
FIG. 11A is a circuit diagram of a FET transistor having a diode electrically connected to its substrate, with the cathode of the diode electrically connected to the gate node of the transistor.
Figure 11B:
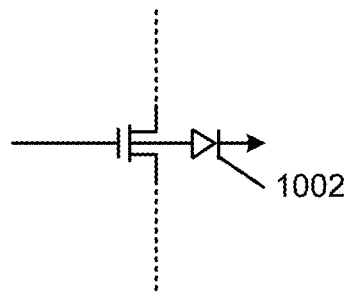
FIG. 11B is a circuit diagram of a FET transistor having a diode electrically connected to its substrate, with the cathode of the diode electrically connected to a separate bias voltage.

One easy way to implement such an accumulated charge sweeping means is by electrically coupling a diode 1100 to the substrate of $M_1$, as shown in FIG. 11A with the cathode of the diode electrically connected to the gate node of $M_1$ In another embodiment, shown in FIG. 11B, a diode 1102 is electrically connected to the substrate of $M_1$ with the cathode of the diode electrically connected to a separate bias voltage. While a diode is shown and preferred, in some embodiments a resistor or body tie also may be used.

Figure 4:
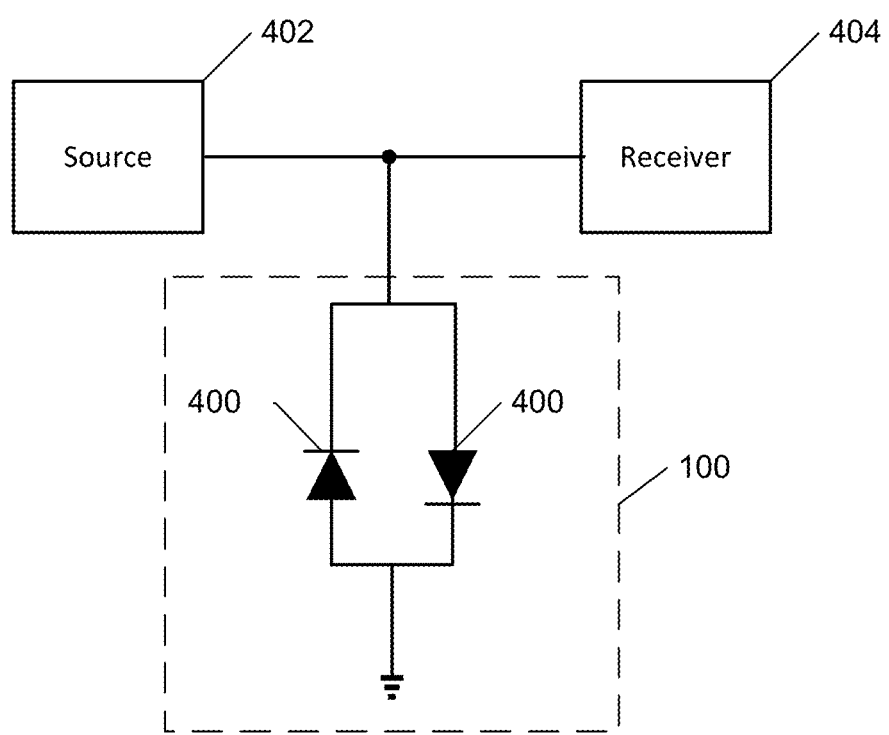
FIG. 4 is a circuit diagram of a prior art limiter comprising two back-to-back diodes.
Figure 12A:
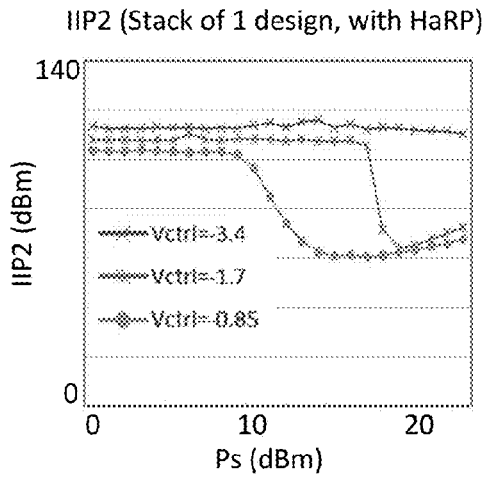
FIG. 12A is a graph showing the measured second order input-referred intercept point (IIP2) as a function of signal power Ps for three different control voltage levels for a particular embodiment in accordance with the present invention.
Figure 12B:
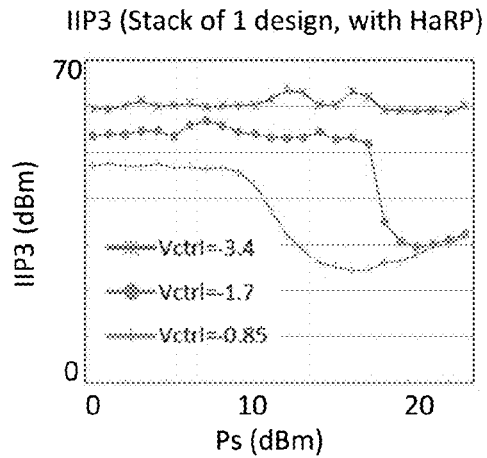
FIG. 12B is a graph showing the measured third order input-referred intercept point (IIP3) as a function of signal power Ps for three different control voltage levels for a particular embodiment in accordance with the present invention.

Adding an accumulated charge sink structure to $M_1$, such as the diode shown in FIGS. 11A and 11B, provides superior linearity compared to the prior art PIN diode approach shown in FIG. 4. Such linearity is shown by way of example for a particular implementation of the present invention in FIG. 12A, which is a conventional graph showing the measured second order input-referred intercept point (IIP2) as a function of signal power Ps for three different control voltage levels Vctrl, and in FIG. 12B, which is a conventional graph showing the measured third order input-referred intercept point (IIP3) as a function of signal power Ps for three different control voltage levels Vctrl.

Figure 13:
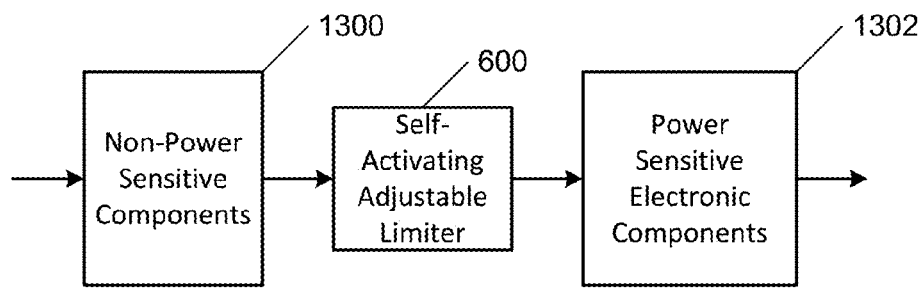
FIG. 13 is a block diagram showing a self-activating adjustable limiter electrically coupled between non-power sensitive electronic components and power sensitive electronic components.

Self-activating adjustable threshold limiters in accordance with the present invention are useful in wide variety of electronic circuits. For example, FIG. 13 is a block diagram showing a self-activating adjustable limiter 600 electrically coupled between non-power sensitive electronic components 1300 and power sensitive electronic components 1302, such as might occur at the front end (input) of a test instrument.

Figure 14:
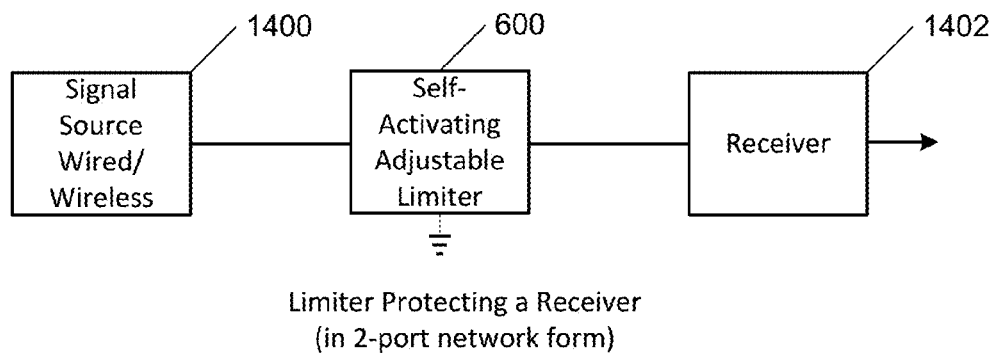
FIG. 14 is a block diagram showing a self-activating adjustable limiter in a 2-port network form electrically coupled between a signal source and a receiver.

FIG. 14 is a block diagram showing a self-activating adjustable limiter 600 in a 2-port network form electrically coupled between a signal source (e.g., wired or wireless communication signal) 1400 and a receiver 1402.

FIG. 15 is a block diagram showing a self-activating adjustable limiter 600 electrically coupled between an antenna 1500 and a wireless receiver 1502. The receiver may be, for example, a radar system, a wireless base-station receiver, or a broadband wireless receiver, such as a cognitive radio receiver (i.e., a receiver which automatically detects available channels in wireless spectrum and changes its reception parameters so more wireless communications may run concurrently in a given spectrum band).

FIG. 16 is a block diagram showing a self-activating adjustable limiter 600 electrically coupled to the output of a power amplifier 1600, to limit power excursions and transients that may occur on the output of the power amplifier 1600. Limiters may also be used in various circuits to provide protection against electrostatic discharge (ESD).

Multiple self-activating adjustable limiters can grouped together in parallel or series to offer customized limiting characteristics. For example, FIG. 17 is a block diagram showing N self-activating adjustable limiters 600 electrically coupled in parallel. Each of the limiters 600 may have the same limiting threshold, or some or all of the limiters may have different limiting thresholds, to provide a customized limiting effect. As another example, FIG. 18 is a block diagram showing N self-activating adjustable limiters 600 electrically coupled in series. Again, each of the limiters 600 may have the same limiting threshold, or some or all of the limiters may have different limiting thresholds, to provide a customized limiting effect. In either case, the control signal for each of the limiters 600 may be provided by a discrete or integrated multiple output circuit, such as the positive voltage generator 2608 and the negative voltage generator 2610 described below with respect to FIG. 23A.

It will be appreciated by practitioners in the art that the parallel and series configurations shown in FIG. 17 and FIG. 18 can be used alone or combined into a wide variety of configurations, such as to handle unique power situations, provide specialized limiting thresholds, or handle particular frequency regimes. For example, a set of series connected limiters 600 may have different threshold levels turning on successively as signal power Ps continues to increase to provide additional attenuation of Ps.

Figure 19:
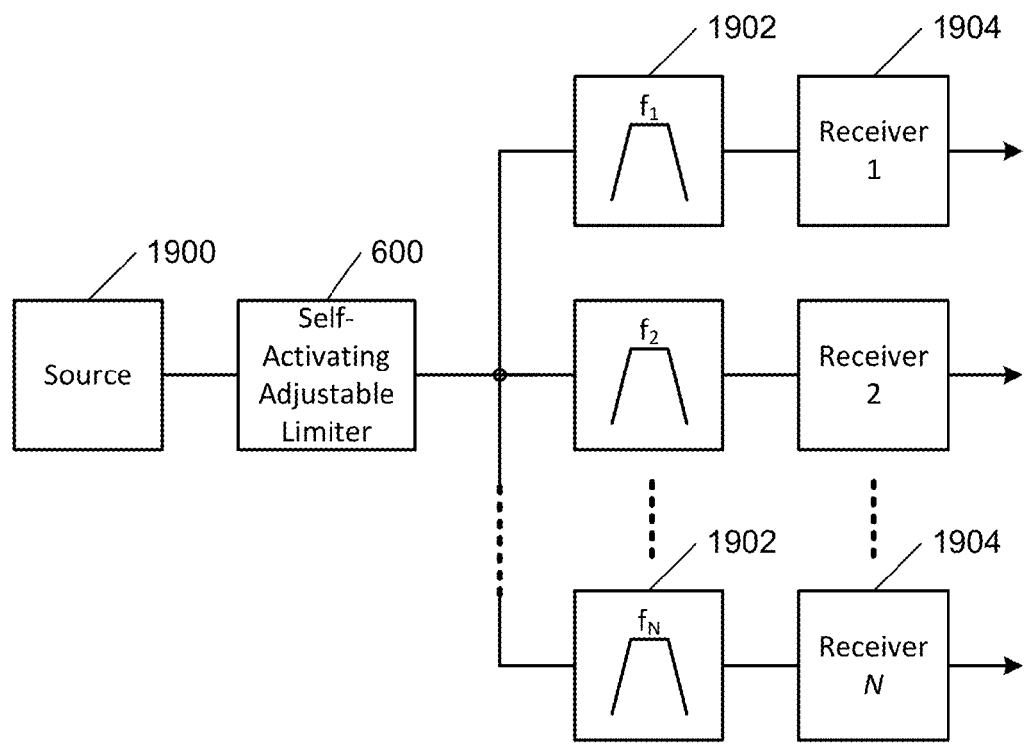
FIG. 19 is a block diagram showing a self-activating adjustable limiter electrically coupled between a source and multiple branches of N parallel sets of filters and receivers.

FIG. 19 is a block diagram showing a self-activating adjustable limiter 600 electrically coupled between a source 1900 and multiple branches of N parallel sets of filters 1902 and receivers 1904, such as may be used in a multi-path or multi-band wireless or wired receiver system (e.g., multi-band cellular telephone system, base station, phased-array radar, and test equipment).

Figure 20:
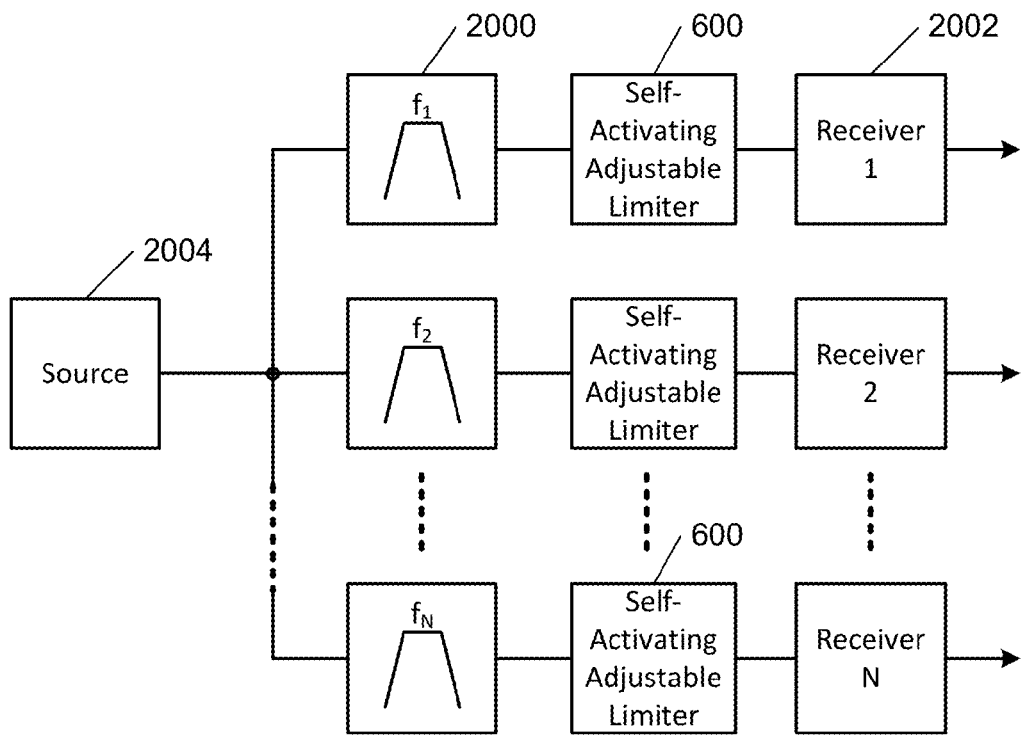
FIG. 20 is a block diagram showing N self-activating adjustable limiters electrically coupled between corresponding filters and receivers in N parallel branches.

FIG. 20 is a block diagram showing N self-activating adjustable limiters 600 electrically coupled between corresponding filters 2000 and receivers 2002 in N parallel branches, with each of the N branches electrically coupled to a source 2004, such as may be used in a multi-path or multi-band wireless or wired receiver system (including the above examples).

The configuration in FIG. 20 is particularly useful because the invention lends itself readily to integration with other circuitry, and makes it cost-effective to providing limiting on multiple branches or multiple ports and paths within an integrated circuit system. In particular, in the configuration of FIG. 20, the power in each filtered frequency band may differ significantly from band to band, and thus providing a self-activating adjustable limiter 600 after each filter may be particularly useful in protecting any of the receivers 2002 that might be exposed to excessive power within their respective bands. In addition, as radio architectures move to more flexible, cognitive architectures, the ability to adjust the power response and other radio parameters of each channel in real time will be a critical requirement.

Figure 21A:
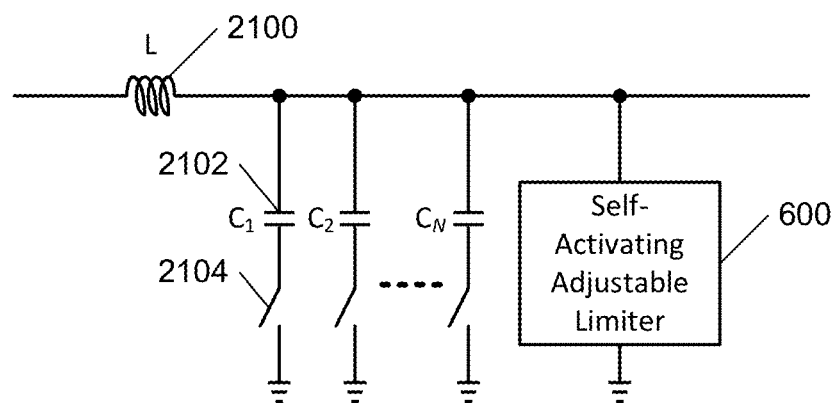
FIG. 21A is a block diagram showing a self-activating adjustable limiter electrically coupled in a single ended form to a digital tuned capacitor circuit.
Figure 21B:
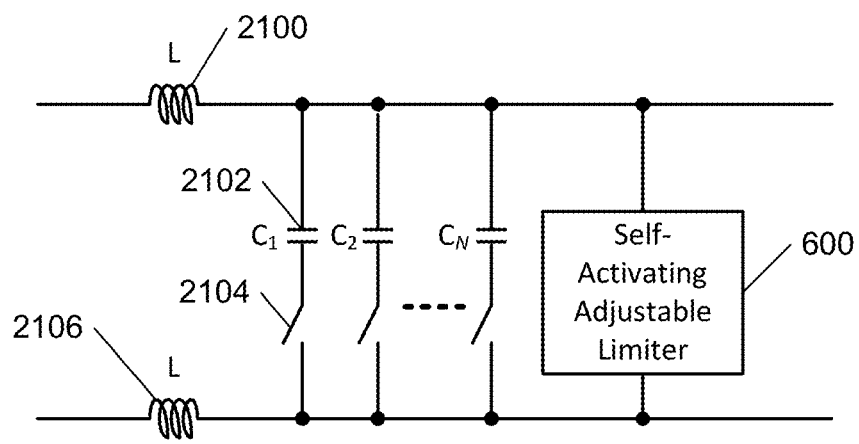
FIG. 21B is a block diagram showing a self-activating adjustable limiter electrically coupled in a differential form to a digital tuned capacitor circuit.

FIG. 21A is a block diagram showing a self-activating adjustable limiter 600 electrically coupled in a single ended form (i.e., with one connection to circuit ground) to a digitally tuned capacitor circuit comprising an inductor 2100 and N branches each comprising a capacitor 2102 and a switch 2104. FIG. 21B is a block diagram showing a self-activating adjustable limiter 600 electrically coupled in a differential form (i.e., with one connection to each of two rails) to a digitally tuned capacitor circuit comprising a first inductor 2100, n branches each comprising a capacitor 2102 and a switch 2104, and a second inductor 2106. The structure and implementation of such digitally tuned capacitor circuits is further described in PCT Publication No. WO2009108391, entitled "Method and Apparatus for Use in Digitally Tuning a Capacitor in an Integrated Circuit Device", assigned to the assignee of the present invention and incorporated herein by this reference.

Figure 22A:
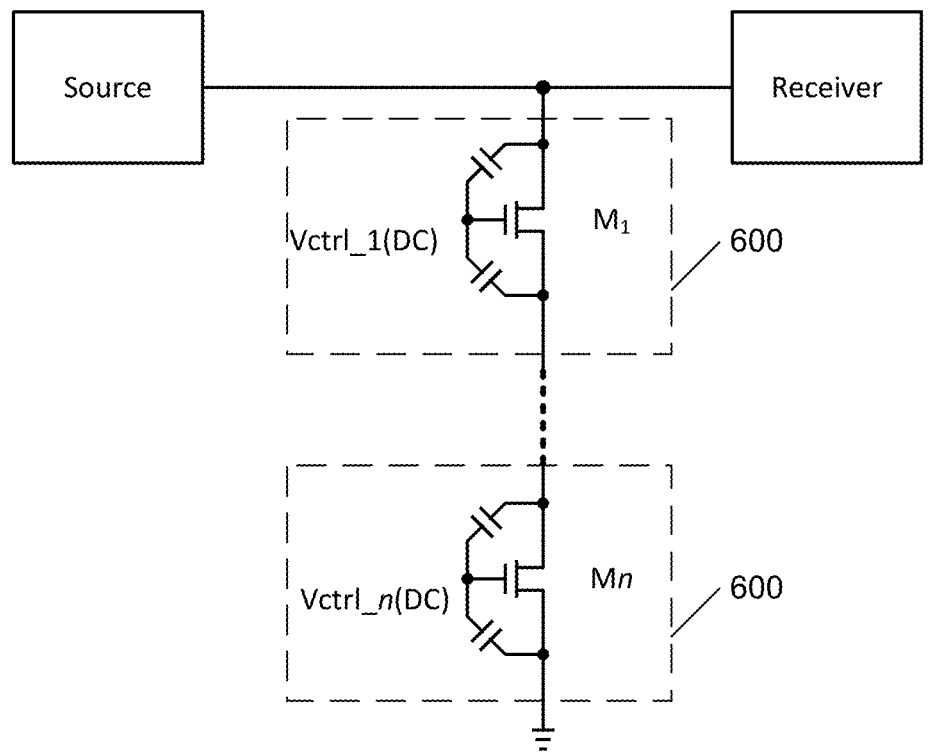
FIG. 22A is a circuit diagram showing stacking of two or more of the self-activating adjustable limiters in accordance with the present invention.

As another example of functional enhancement using particular implementation technologies, by using a silicon on insulator (SOI), silicon on sapphire (SOS), or any other technology in which individual FETs can be sufficiently isolated from each other to enable stacking and voltage division (such as HR Si, SI Si, multi-well CMOS, or GaAs technology), two or more of the self-activating adjustable limiters 600 in accordance with the present invention may be stacked within a single integrated circuit structure, as shown in FIG. 22A. Such stacking provides a higher effective Vmax for the limiter circuitry as a whole (i.e., a Vmax_total), where Vmax is normally the maximum voltage that may be applied to a single limiter 600 before the limiter is physically damaged. For example, when the gate voltages for the n transistors $M_1 \ldots M_n$ of the stacked limiters 600 are all set at the same Vctrl, the limiter stack can withstand n times higher maximum voltage than a single limiter 600. That is, Vth_lim for n stacked limiters 600 is $n*((C1+C2)/C1)*(Vth-Vctrl)$.

The stack configuration in FIG. 22A lends itself to fine tuning a desired Vth_lim. In particular, the gate control voltage for each transistor $M_1 \ldots M_n$ in the stack of limiters 600 can be set individually to implement desired limiter characteristics (using, for example, the positive voltage generator 2608 and the negative voltage generator 2610 described below with respect to FIG. 23A). For example, when the gate control voltage Vctrl of one of the n transistors $M_1 \ldots M_n$ in the stack is set at a sufficiently positive value so that the transistor is in triode mode at all times regardless of the signal condition, the effective Vth_lim for the stack of limiters 600 is reduced (i.e., the stack number of n limiters 600 is essentially reduced by one limiter). Through this technique, the same limiter stack can be reconfigured for different Vth_lim and Vmax_total relationships. The closer Vth_lim is to Vmax_total, the better is the linearity of the limiter stack when it is not triggered into limiting mode.

Figure 22B:
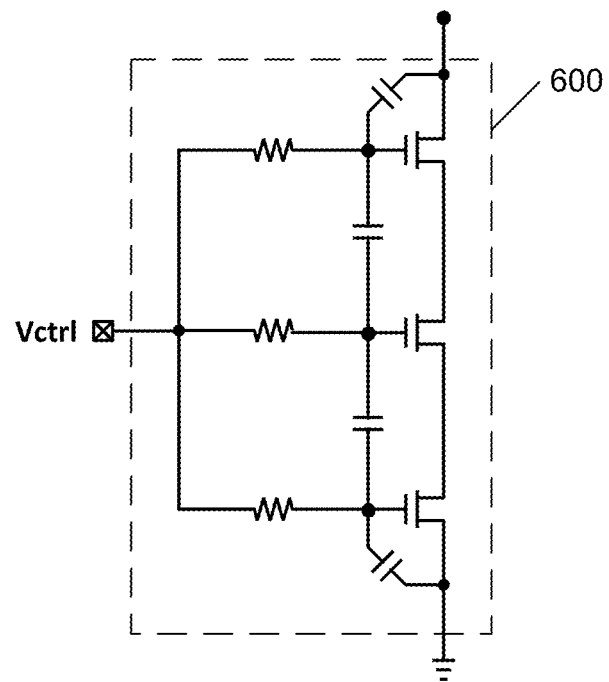
FIG. 22B is a circuit diagram showing stacking multiple self-activating adjustable limiters in accordance with the present invention within a single integrated structure.

FIG. 22B is a circuit diagram showing a variant of FIG. 22A, in which multiple self-activating adjustable LE's in accordance with the present invention are stacked within a single integrated structure.

As should be apparent to a practitioner in the art, any combination of stacked LE devices and control voltages may be used, with the control voltages being all the same, all different, or the same for one or more LE's and different one or more other LE's, or any combination of the above.

Figure 22C:
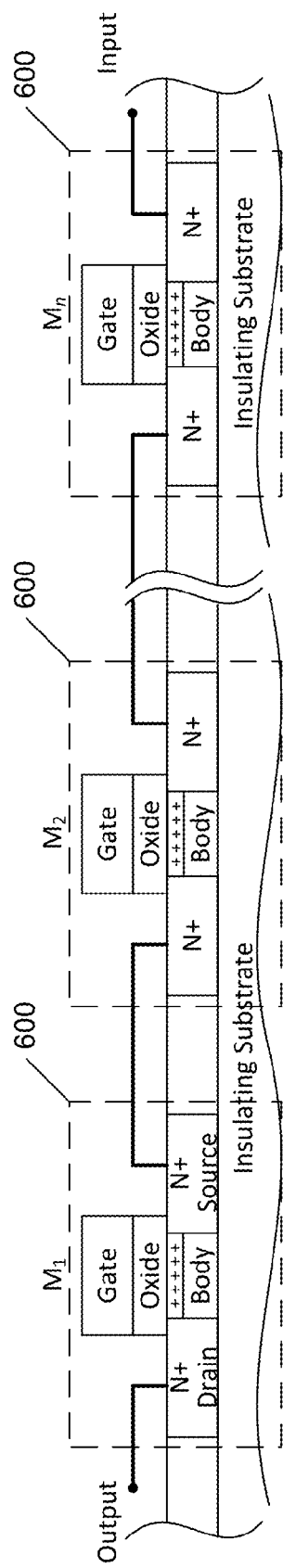
FIG. 22C is a cross-sectional view of stacked limiters of the type shown in FIG. 22A and FIG. 22B, as implemented in a technology with an insulating substrate.

FIG. 22C is a cross-sectional view of stacked self-activating adjustable limiters of the type shown in FIG. 22A and FIG. 22B, as implemented in an isolating fabrication technology. As can be seen, the limiters 600 are implemented in unit cells of $M_1 \ldots M_n$ FETs. Each FET transistor $M_x$ is essentially identical in structure (although each may have a different Vctrl applied), with the end FETs $M_1$, $M_n$ having terminals designated "input" and "output" (usually arbitrarily, since the structure is generally symmetrical), and the middle FETs being internally coupled to adjacent FETs as shown (i.e., source to drain on one side, and drain to source on the other side). In this particular example, the coupling elements $CE_1$ and $CE_2$ are the respective inherent capacitances between the drain and gate ($CE_1$), and between the source and gate ($CE_2$).

As can be seen from the example embodiment in FIG. 22C, the structure of the present invention lends itself quite nicely to fabrication as an integrated circuit, and in particular as multiple units within an integrated circuit.

Figure 23A:
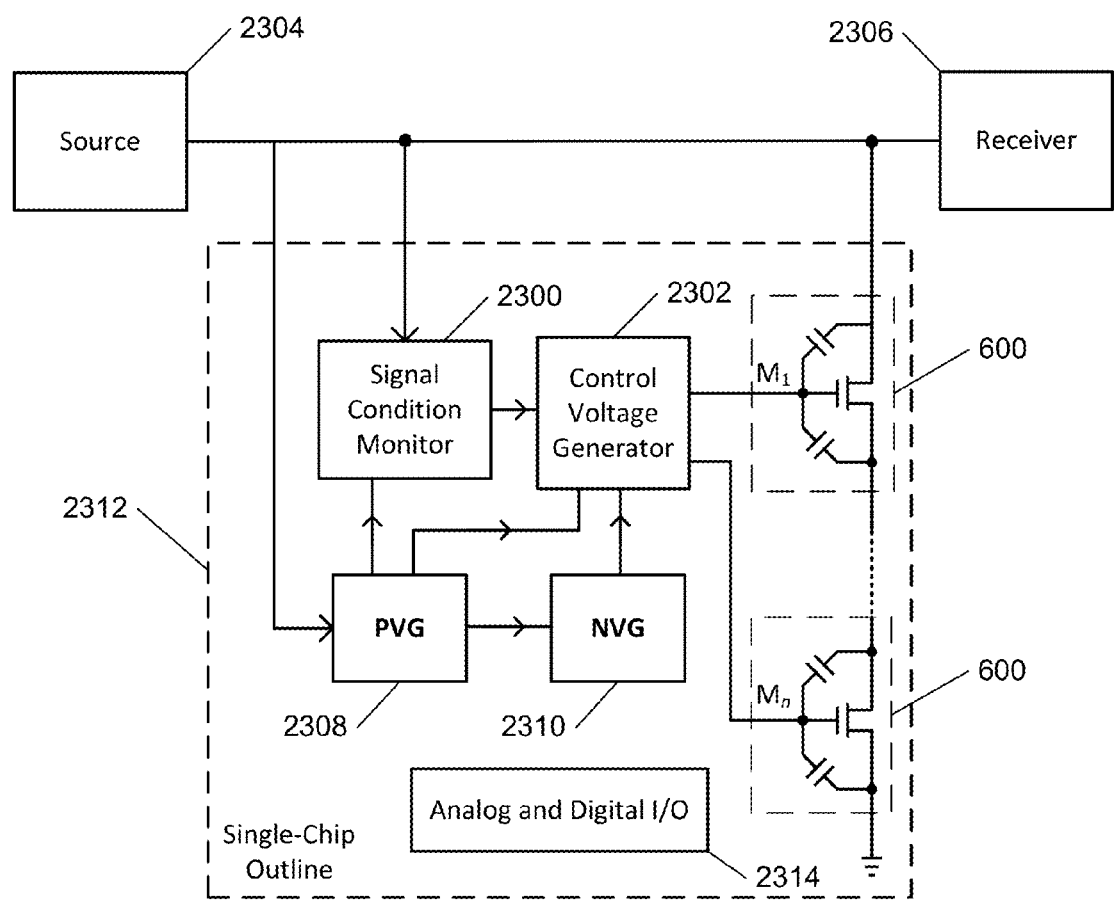
FIG. 23A is a block diagram showing that one or more limiters in accordance with the present invention electrically coupled to a signal condition monitor, a control voltage generator, and other circuitry.

A limiter in accordance with the present invention allows a number of functions not known in or generally difficult to implement in the prior art. For example, in order to provide self-protection from prolonged exposure to high power input signals, it is possible to integrate a signal condition monitor and a control voltage generation circuit that can actively control a limiter or limiter stack in accordance with the present invention, based on a measured characteristic of the signal from a source. FIG. 23A is a block diagram showing that one or more limiters $600_1 \ldots 600_n$ can be electrically coupled as shown to a signal condition monitor 2300 and a control voltage generator 2302.

The signal condition monitor 2300 measures a desired characteristic of the output signal from a source 2304, such as power, voltage, or current. The signal condition monitor 2300 may be, for example, a power/voltage detector of the type shown in FIGS. 5A and 5B. The signal condition monitor 2300 may also include a simple RC timing circuit or a digital counter for timing detection designed to output a trigger signal if a measured signal characteristic has occurred for a set time.

Figure 23B:
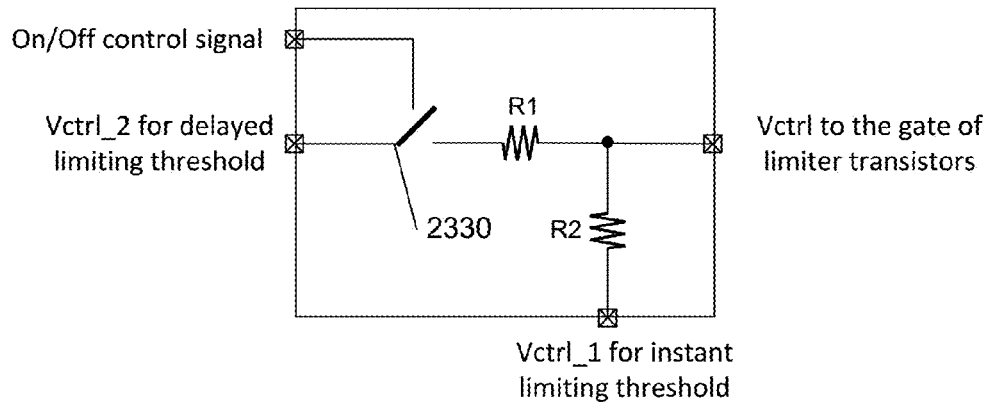
FIG. 23B is a circuit diagram of a control voltage generator.

The control voltage generator 2302 may consist of switches, resistive networks, or other circuitry. One example is discussed below with respect to FIG. 23B, which is a circuit diagram of a simple resistive network comprising resistors R1 and R2. The input to R2 is Vctrl_1, set to regulate the instant limiting threshold of one or more self-activating adjustable limiters 600. The input to R1 is determined by a switch 2330, controlled by a binary trigger signal from the signal condition monitor 2300. If the switch 2330 is "open", no voltage is applied to R1, in which case the output of the circuit, Vctr, is just Vctrl_1. If the switch 2330 is "closed", then a second voltage, Vctrl_2, is applied to R1, in which case the output of the circuit, Vctr, is the sum of Vctrl_1 and Vctrl_2. Vctrl_2 may be set at a level sufficient to drive the limiters 600 into triode (fully conducting) mode. Alternatively, Vctrl_2 can provide a different level of sensitivity to Ps. Regardless, Vctrl_1 and Vctrl2 can be set independently to address unique operating scenarios.

The self-activating adjustable limiters $600_1 \ldots 600_n$ automatically limit the signal from an electrically coupled source 2304 to a receiver 2306, as described above. Concurrently, the signal condition monitor 2300 is electrically coupled to monitor the same signal for high amplitude (and hence high power) excursions in excess of a pre-set threshold value, and triggers the control voltage generator 2302 whenever such excursions occur. If the excursions persist for longer than a preset time (as determined by the RC parameters or count of the signal condition monitor 2300), the control voltage generator 2302 provides a positive high bias voltage (with respect to Vth of the transistor) and turns the limiters $600_1 \ldots 600_n$ to "on" (triode) mode to shunt the signal to ground through the minimal resistance of the switching elements of the limiters $600_1 \ldots 600_n$. In an alternate embodiment, the circuitry of the signal condition monitor 2300 and the control voltage generator 2302 may be combined into a single subcircuit.

Figure 23C:
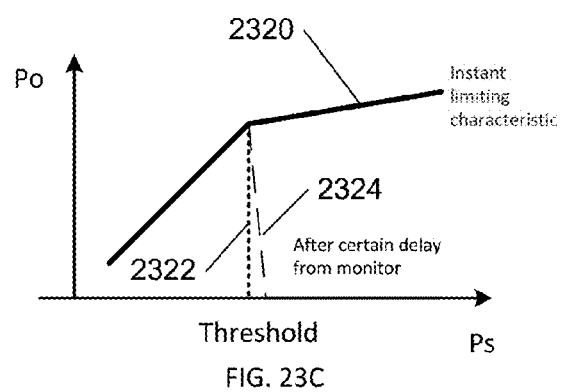
FIG. 23C is a diagram showing the Ps-Po characteristic curve for the limiter circuit of FIG. 23A.

FIG. 23C is an example diagram showing the Ps-Po characteristic curve for one embodiment of the limiters $600_1 \ldots 600_n$ of FIG. 23A. Curve 2320 shows that the circuit limits the output power to a certain level instantly at a designed threshold point 2322. The dashed line 2324 indicates that, after a delay determined by the signal condition monitor 2600 based on an over-limit signal, the control voltage generator 2302 drives the limiters $600_1 \ldots 600_n$ "on" and thus shunts the output signal Po to ground. The output signal Po will be reduced to a significantly lower (but non-zero) value because FETs in triode mode have very low turn on resistance. Both instant limiting threshold and delayed limiting threshold can be programmed separately, as described above.

The circuit shown in FIG. 23A can be further enhanced by adding a positive voltage generator 2308 and a negative voltage generator 2310, electrically coupled as shown in FIG. 23A. Such voltage generators may be implemented, for example, as shown in U.S. Pat. No. 7,719,343, U.S. Patent Pub. No. US-2011-0156819-A1, and U.S. Patent Pub. No. US-2012-0038344, all assigned to the assignee of the present invention and incorporated herein by this reference. The outputs of the positive voltage generator 2308 and the negative voltage generator 2310 may be selectively electrically coupled by the control voltage generator 2302 to the control inputs of the self-activating adjustable limiters $600_1 \ldots 600_n$. In this way, different limiting characteristics (e.g., different Vth_lim for a stack of limiters $600_1 \ldots 600_n$, as described with respect to FIG. 22A, or different time-outs, or different Vth_lim for independent LE devices) can be implemented by a single circuit by selecting different control voltage settings for the limiters $600_1 \ldots 600_n$. Notably, the thresholds of instant limiting and delayed limiting can be configured separately.

The circuitry shown in FIG. 23A bounded by outline box 2312 lends itself to being fabricated as part of an integrated circuit. If so, additional analog and digital input/output circuitry 2314 may be included, in known fashion. Further, additional circuitry may be added, such as a limiting element LE in series with the signal from the source 2304 to the receiver 2306.

Figure 23D:
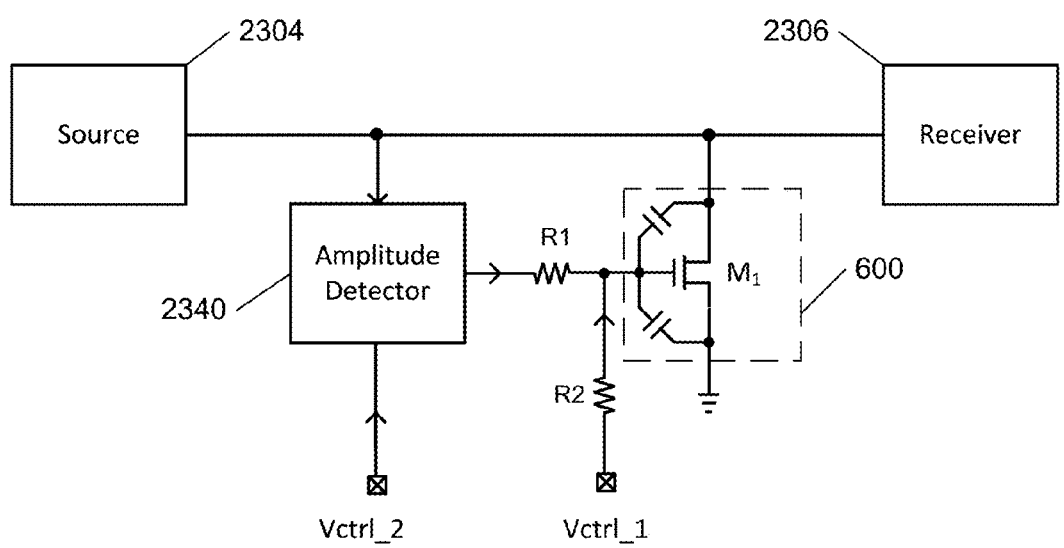
FIG. 23D is a circuit diagram of a simplified version of the circuit of FIG. 23A.

FIG. 23D is a circuit diagram of a simplified version of the circuit of FIG. 23A, showing an amplitude detector 2340 coupled to measure the amplitude of a signal from an electrically coupled source 2304 to a receiver 2306. Normally, the control voltage to the gate node of FET $M_1$ is Vctrl_1 through resistor R2. Vctrl_1 is set to regulate the instant limiting threshold of $M_1$. However, if the amplitude detector determines that the signal amplitude from the source 2304 exceeds a set level, then Vctrl_2 is coupled through R1 to the gate node of $M_1$. Vctrl_2 is set at a level sufficient to drive the limiters 600 into triode (fully conducting) mode.

Figure 24:
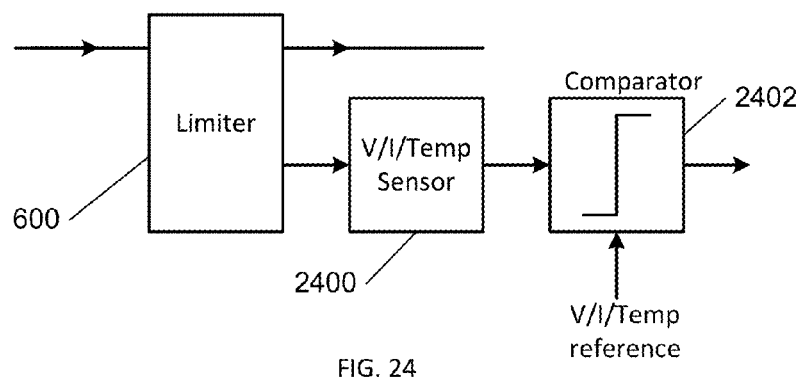
FIG. 24 is a block diagram showing a self-activating adjustable limiter configured with other circuitry as a power and/or amplitude detector.

FIG. 24 is a block diagram showing a self-activating adjustable limiter 600 configured with other circuitry as a power and/or amplitude detector. In limiting mode, the current going through the transistor (or transistors, if in a stacked configuration) of the limiter 600, the voltage across the transistor terminals, and the temperature rise of the transistor(s) are all valid indictors of the signal applied to the input of the limiter 600. Therefore, with proper integration of a voltage sensor, current sensor, or temperature sensor 2400 and a comparator circuit 2402 with suitable reference inputs, the limiter 600 can also carry out the function of power and/or amplitude detection. In other words, a self-activating adjustable limiter 600 in accordance with the present teachings provides information regarding its state, and this state information can be combined with other system or external information to generate a control signal.

Figure 25:
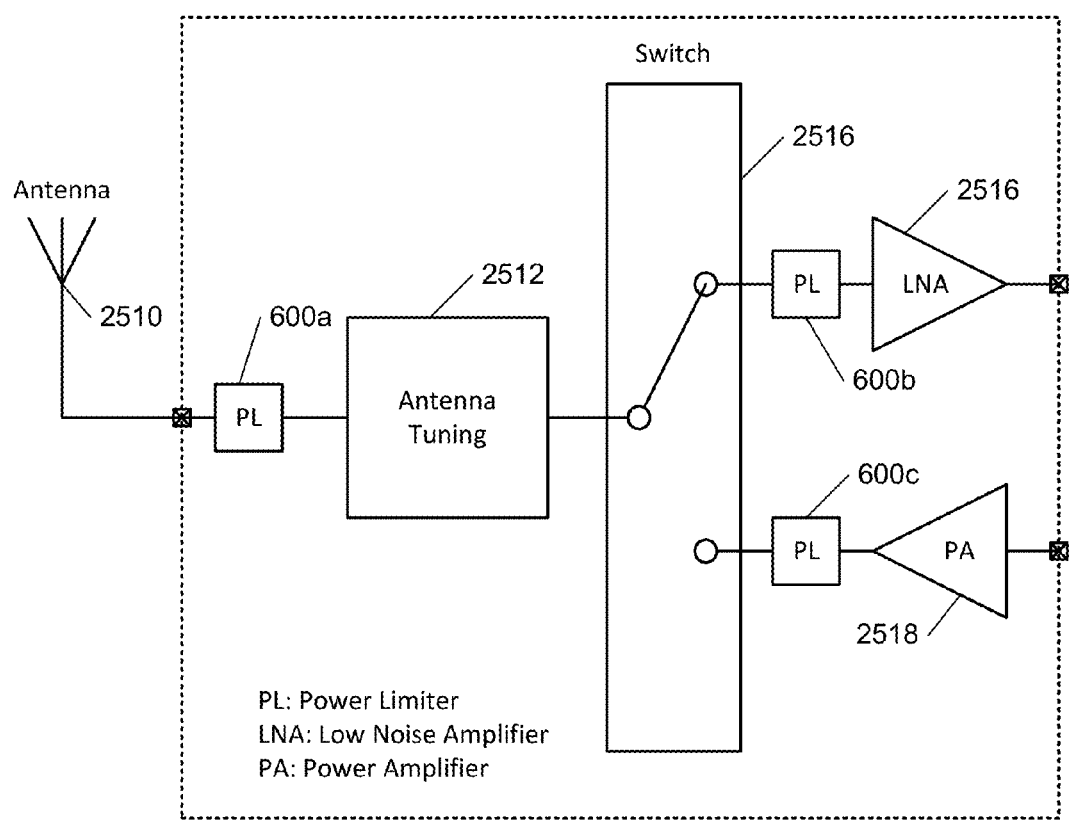
FIG. 25 is a block diagram self-activating adjustable limiters in a radio frequency transceiver circuit.

FIG. 25 is a block diagram self-activating adjustable limiters 600 in a radio frequency transceiver circuit. Shown is a typical RF "front end", or transceiver, with an antenna 2510 coupled through a limiter 600a to a conventional tuning circuit 2512. A switch 2516 couples that signal path either through another limiter 600b to a low noise amplifier 2516 when receiving a signal, or through another limiter 600c to a power amplifier 2518 when transmitting a signal. The ability to integrate multiple limiters 600 in accordance with the invention provides the opportunity to protect multiple signal paths within a single circuit or system.

Use of Accumulated Charge Sink Implementation Technology

As noted above, in some embodiments of the invention, the limiting element LE can be implemented as a FET. A useful enhancement to the present invention is to utilize FETs implemented in accordance with improved process and integrated circuit design advancements developed by the assignee of the present application. One such advancement comprises the "HaRP™" technology enhancements developed by the assignee of the present application. The HaRP enhancements provide for new RF architectures and improved linearity in RF front end solutions. FETs made in accordance with the HaRP enhancements are described in pending applications and patents owned by the assignee of the present application. For example, FETs made in accordance with the HaRP enhancements are described in U.S. Pat. Nos. 7,910,993 and 8,129,787, both of which are entitled "Method and Apparatus for use in Improving Linearity of MOSFETs Using an Accumulated Charge Sink"; and in pending U.S. patent application Ser. No. 13/277,108, filed on Oct. 19, 2011, and Ser. No. 13/412,529, filed on Mar. 5, 2012. Disclosures in each of U.S. Pat. Nos. 7,910,993 and 8,129,787 as well as pending U.S. patent application Ser. Nos. 13/277,108 and 13/412,529 are incorporated herein by reference in their entirety.

Figure 26:
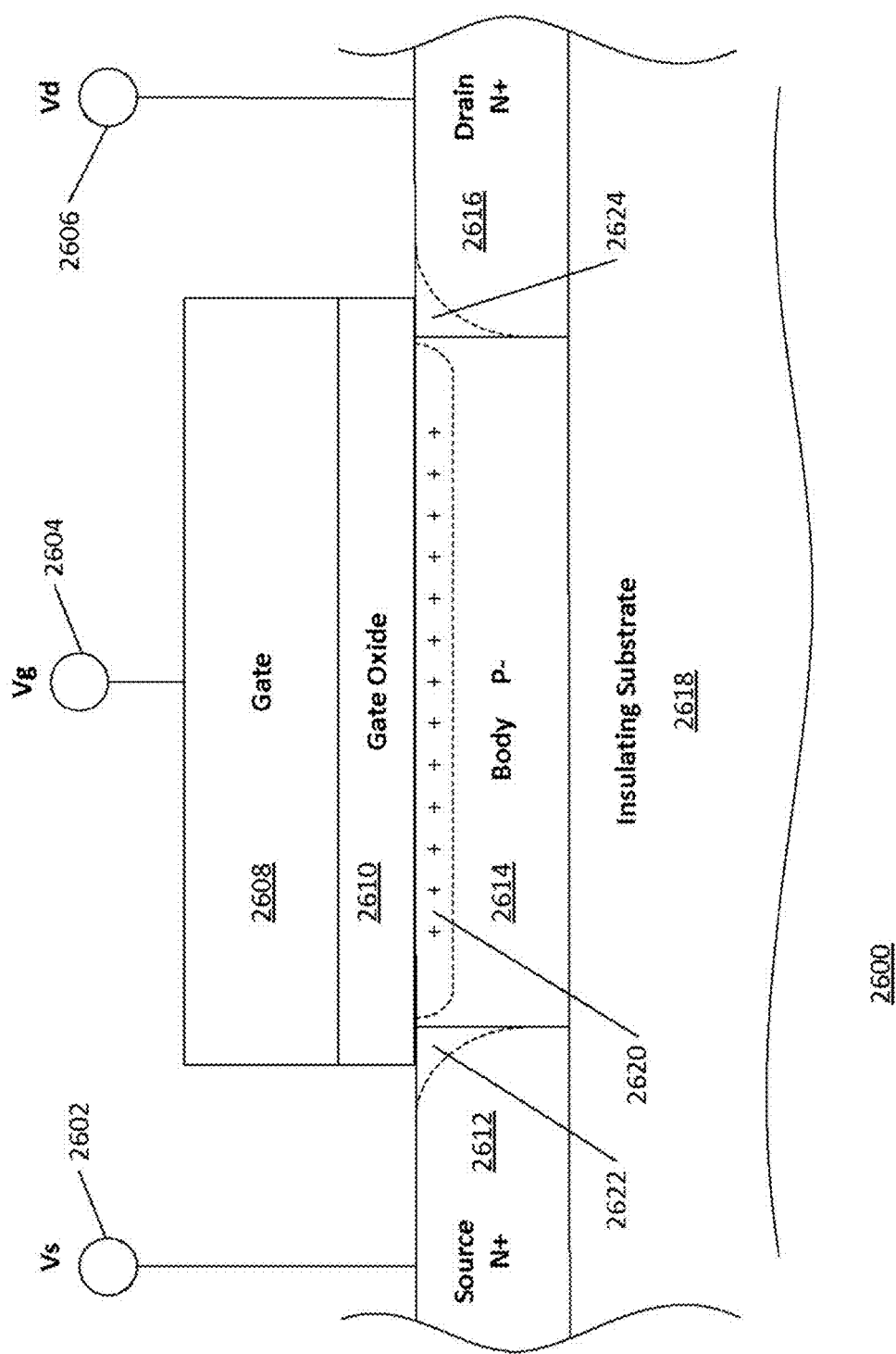
FIG. 26 is a cross-sectional view of an exemplary SOI NMOSFET.

As is well known, a MOSFET employs a gate-modulated conductive channel of n-type or p-type conductivity, and is accordingly referred to as an NMOSFET or PMOSFET, respectively. In the description that follows, a silicon-on-insulator (SOI) MOSFET is used as an example, but as noted below, other technologies having similar characteristics may be used. FIG. 26 shows a cross-sectional view of an exemplary SOI NMOSFET 2600. As shown in FIG. 26, the exemplary SOI NMOSFET 2600 includes an insulating substrate 2618 that may comprise a buried oxide layer, sapphire, or other insulating material. A source 2612 and drain 2616 of the NMOSFET 2600 comprise N+ regions (i.e., regions that are heavily doped with an "n-type" dopant material) produced by ion implantation into a silicon layer positioned above the insulating substrate 2618. (The source and drain of PMOSFETs comprise P+ regions, i.e., regions heavily doped with "p-type" dopant material). The body 2614 comprises a P− region (i.e., a region that is lightly doped with a "p-type" dopant), produced by ion implantation, or by dopants already present in the silicon layer when it is formed on the insulating substrate 2618. As shown in FIG. 26, the NMOSFET 2600 also includes a gate oxide 2610 positioned over the body 2614. The gate oxide 2610 typically comprises a thin layer of an insulating dielectric material such as $SiO_2$. The gate oxide 2610 electrically insulates the body 2614 from a gate 2608 positioned over the gate oxide 2610. The gate 2608 comprises a layer of metal or, more typically, polysilicon.

A source terminal 2602 is operatively coupled to the source 2612 so that a source bias voltage "Vs" may be applied to the source 2612. A drain terminal 2606 is operatively coupled to the drain 2616 so that a drain bias voltage "Vd" may be applied to the drain 2616. A gate terminal 2604 is operatively coupled to the gate 2608 so that a gate bias voltage "Vg" may be applied to the gate 2608.

As is well known, for an enhancement mode MOSFET, for example, the gate bias creates a so-called "inversion channel" in a channel region of the body 2614 under the gate oxide 2610. The inversion channel comprises carriers having the same polarity (e.g., "P" polarity (i.e., hole carriers), or "N" polarity (i.e., electron carriers) carriers) as the polarity of the source and drain carriers, and it thereby provides a conduit (i.e., channel) through which current passes between the source and the drain. For example, as shown in the SOI NMOSFET 2600 of FIG. 26, when a sufficiently positive voltage is applied between the gate 2608 and the source 2612 (i.e., a positive gate bias exceeding a threshold voltage $V_{th}$), an inversion channel is formed in the channel region of the body 2614. As noted above, the polarity of carriers in the inversion channel is identical to the polarity of carriers in the source and drain. In this example, because the source and drain comprise "n-type" dopant material and therefore have N polarity carriers, the carriers in the channel comprise N polarity carriers. Similarly, because the source and drain comprise "p-type" dopant material in PMOSFETs, the carriers in the channel of turned on (i.e., conducting) PMOSFETs comprise P polarity carriers.

As is well known, depletion mode MOSFETs operate similarly to enhancement mode MOSFETs; however, depletion mode MOSFETs are doped so that a conducting channel exists even without a voltage being applied to the gate. When a voltage of appropriate polarity is applied to the gate, the channel is depleted. This, in turn, reduces the current flow through the deletion mode device. Both enhancement and depletion mode MOSFETs have a gate voltage threshold, $V_{th}$, at which the MOSFET changes from an off-state (non-conducting) to an on-state (conducting).

As described in the disclosures of U.S. Pat. Nos. 7,910, 993 and 8,129,787 as well as pending U.S. patent application Ser. Nos. 13/277,108 and 13/412,529, no matter what mode of operation an SOI MOSFET employs (i.e., whether enhancement or depletion mode), when the MOSFET is operated in an off-state (i.e., the gate voltage does not exceed $V_{th}$), and when a sufficient nonzero gate bias voltage is applied with respect to the source and drain, an "accumulated charge" may occur under the gate. The "accumulated charge", as defined in more detail below and in the disclosures of U.S. Pat. Nos. 7,910,993 and 8,129,787 as well as pending U.S. patent application Ser. Nos. 13/277,108 and 13/412,529, is similar to the "accumulation charge" described in the literature in reference to MOS capacitors. However, the literature describes "accumulation charge" as referring only to bias-induced charge existing under a MOS capacitor oxide, where the accumulation charge is of the same polarity as the majority carriers of the semiconductor material under the capacitor oxide. In contrast, and as described below in more detail, "accumulated charge" is used herein to refer to gate-bias induced carriers that may accumulate in the body of an off-state MOSFET, even if the majority carriers in the body do not have the same polarity as the accumulated charge. This situation may occur, for example, in an off-state depletion mode NMOSFET, where the accumulated charge may comprise holes (i.e., having P polarity) even though the body doping is N− rather than P−.

For example, as shown in FIG. 26, when the SOI NMOSFET 2600 is biased to operate in an off-state, and when a sufficient nonzero voltage is applied to the gate 2608, an accumulated charge 2620 may accumulate in the body 2614 underneath and proximate the gate oxide 2610. The operating state of the SOI NMOSFET 2600 shown in FIG. 26 is referred to herein as an "accumulated charge regime" of the MOSFET. The accumulated charge regime is defined in more detail below. The causes and effects of the accumulated charge in SOI MOSFETs are now described in more detail.

As is well known, electron-hole pair carriers may be generated in MOSFET bodies as a result of several mechanisms (e.g., thermal, optical, and band-to-band tunneling electron-hole pair generation processes). When electron-hole pair carriers are generated within an NMOSFET body, for example, and when the NMOSFET is biased in an off-state condition, electrons may be separated from their hole counterparts and pulled into both the source and drain. Over a period of time, assuming the NMOSFET continues to be biased in the off-state, the holes (resulting from the separated electron-hole pairs) may accumulate under the gate oxide (i.e., forming an "accumulated charge") underneath and proximate the gate oxide. A similar process occurs in similarly biased PMOSFET devices (with the behavior of electrons and holes reversed). This phenomenon is now described with reference to the SOI NMOSFET 2600 of FIG. 26.

When the SOI NMOSFET 2600 is operated with gate, source, and drain bias voltages that deplete the channel carriers in the body 2614 (i.e., the NMOSFET 2600 is in the off-state), holes may accumulate underneath and proximate the gate oxide 2610. For example, if the source bias voltage Vs and the drain bias voltage Vd are both zero (e.g., connected to a ground contact, not shown), and the gate bias voltage Vg comprises a sufficiently negative voltage with respect to ground and with respect to $V_{th}$, holes present in the body 2614 become attracted to the channel region proximate the gate oxide 2610. Over a period of time, unless removed or otherwise controlled, the holes accumulate underneath the gate oxide 2610 and result in the accumulated charge 2620 shown in FIG. 26. The accumulated charge 2620 is therefore shown as positive "+" hole carriers in FIG. 26. In the example given, Vg is negative with respect to Vs and Vd, so electric field regions 2622 and 2624 may also be present.

An accumulated charge regime is defined as follows. The accumulated charge is opposite in polarity to the polarity of carriers in the channel. Because, as described above, the polarity of carriers in the channel is identical to the polarity of carriers in the source and drain, the polarity of the accumulated charge 2620 is also opposite to the polarity of carriers in the source and drain. For example, under the operating conditions described above, holes (having "P" polarity) accumulate in off-state NMOSFETs, and electrons (having "N" polarity) accumulate in off-state PMOSFETs. Therefore, a MOSFET device is defined herein as operating within the "accumulated charge regime" when the MOSFET is biased to operate in an off-state, and when carriers having opposite polarity to the channel carriers are present in the channel region. Stated in other terms, a MOSFET is defined as operating within the accumulated charge regime when the MOSFET is biased to operate in an off-state, and when carriers are present in the channel region having a polarity that is opposite the polarity of the source and drain carriers.

For example, and referring again to FIG. 26, the accumulated charge 2620 comprises hole carriers having P or "+" polarity. In contrast, the carriers in the source, drain, and channel (i.e., when the FET is in the on-state) comprise electron carriers having N or "−" polarity. The SOI NMOSFET 2600 is therefore shown in FIG. 26 as operating in the accumulated charge regime. It is biased to operate in an off-state, and an accumulated charge 2620 is present in the channel region. The accumulated charge 2620 is opposite in polarity (P) to the polarity of the channel, source, and drain carriers (N).

In another example, wherein the SOI NMOSFET 2600 comprises a depletion mode device, $V_{th}$ is negative by definition. According to this example, the body 2614 comprises an N− region (as contrasted with the P− region shown in FIG. 26). The source and drain comprise N+ regions similar to those shown in the enhancement mode MOSFET 2600 of FIG. 26. For Vs and Vd both at zero volts, when a gate bias Vg is applied that is sufficiently negative relative to $V_{th}$ (for example, a Vg that is more negative than approximately −1 V relative to $V_{th}$), the depletion mode NMOSFET is biased into an off-state. If biased in the off-state for a sufficiently long period of time, holes may accumulate under the gate oxide and thereby comprise the accumulated charge 2620 shown in FIG. 26.

In other examples, Vs and Vd may comprise nonzero bias voltages. In some embodiments, Vg must be sufficiently negative to both Vs and Vd (in order for Vg to be sufficiently negative to $V_{th}$, for example) in order to bias the NMOSFET in the off-state. Those skilled in the MOSFET device design arts shall recognize that a wide variety of bias voltages may be used to practice the present teachings. As described below in more detail, the present disclosed methods and apparatuses contemplate use in any SOI MOSFET device biased to operate in the accumulated charge regime.

SOI MOSFETs are often used in applications in which operation within the accumulated charge regime adversely affects MOSFET performance, such as the case when using a MOSFET for transistor $M_1$ in implementing a limiter in accordance with the present invention. As described below in more detail, unless the accumulated charge is removed or otherwise controlled, it detrimentally affects performance of SOI MOSFETs under certain operating conditions. One exemplary application, described above, is the use of SOI MOSFETs in the implementation of fast response self-activating adjustable threshold limiters 600, particularly when used in RF applications. It has been discovered that unless the accumulated charge is removed or otherwise controlled, under some operating conditions, the accumulated charge adversely affects the linearity of the SOI MOSFET and thereby increases harmonic distortion and intermodulation distortion (IMD) caused by the MOSFET when used in the implementation of such circuits. In addition, it has been discovered that removal or control of the accumulated charge improves the drain-to-source breakdown voltage (i.e., the "BVDSS") characteristics of the SOI MOSFETs.

Figure 27:
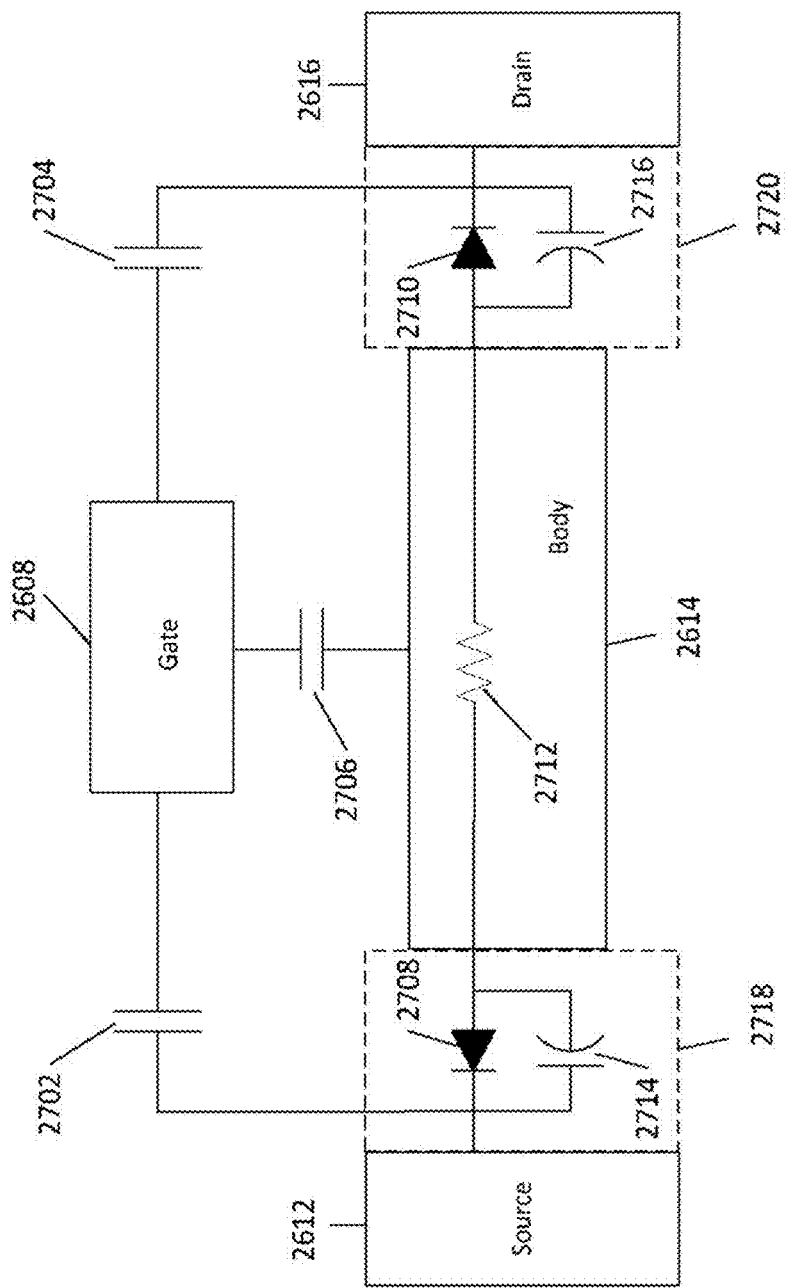
FIG. 27 is a simplified schematic of an electrical model showing the off-state impedance characteristics of the exemplary SOI NMOSFET of FIG. 26.

FIG. 27 is a simplified schematic of an electrical model 2700 showing off-state impedance (or conversely, conductance) characteristics of the exemplary SOI NMOSFET 2600 of FIG. 26. More specifically, the model 2700 shows the impedance characteristics from the source 2612 to the drain 2616 when the NMOSFET 2600 is operated in the off-state. Because the drain-to-source off-state impedance characteristic of the NMOSFET 2600 is primarily capacitive in nature, it is referred to herein as the drain-to-source off-state capacitance $C_{off}$.

When the NMOSFET 2600 is in the off-state, and when the accumulated charge 2620 shown in FIG. 26 is not present in the body 2614 (i.e., the NMOSFET 2600 is not operating within the accumulated charge regime), the body 2614 is depleted of charge carriers. In this case the body impedance 2712 is analogous to the impedance of an insulator, and the electrical conductance through the body 2614 is very small (i.e., the NMOSFET 2600 is in the off-state). Consequently, the principal contributions to the drain-to-source off-state capacitance $C_{off}$ are provided by capacitors 2702 and 2704, where capacitor 2702 represents capacitance between the source 2612 and the gate 2608 and capacitance 2704 represents capacitance between the drain 2616 and the gate 2608.

However, when the NMOSFET 2600 operates within the accumulated charge regime, and the accumulated charge 2620 is therefore present in the body 2614, mobile holes comprising the accumulated charge produce p-type conductivity between source-body junction 2718 and drain-body junction 2720. In effect, the accumulated charge 2620 produces an impedance between the junctions in the absence of the accumulated charge. If a Vds voltage is applied between the drain 2616 and the source 2612, the mobile holes redistribute according to the electrical potentials that result within the body 2614. DC and low-frequency current flow through the SOI NMOSFET 2600 is prevented by the diode properties of the source-body junction 2718 and the drain-body junction 2720, as represented by junction diodes 2708 and 2710, respectively. That is, because the junction diodes 2708 and 2710 are anti-series (i.e., "back-to-back") in this case, no DC or low-frequency currents flow through the SOI NMOSFET 2600. However, high-frequency currents may flow through the SOI NMOSFET 2600 via the capacitances of the source-body junction 2718 and the drain-body junction 2720, as represented by junction capacitors 2714 and 2716, respectively.

Voltage dependencies of the junction capacitors 2714 and 2716, the gate-to-source 2702 and gate-to-drain capacitors 2704, and a direct capacitance (not shown) between the source 2612 and the drain 2616, cause nonlinear behavior in off-state capacitance $C_{off}$ of the MOSFET when AC voltages are applied to the NMOSFET 2600, thereby producing undesirable generation of harmonic distortions and intermodulation distortion (IMD). The relative contributions of these effects are complex, and depend on fabrication processes, biases, signal amplitudes, and other variables. However, those skilled in the electronic device design arts shall understand from the teachings below that reducing, removing, or otherwise controlling the accumulated charge provides an overall improvement in the nonlinear behavior of $C_{off}$. In addition, because the body impedance 2712 is significantly decreased in the presence of the accumulated charge 2620, the magnitude of $C_{off}$ may be increased when the FET operates in the accumulated charge regime. Reducing, removing, or otherwise controlling the accumulated charge also mitigates this effect.

No matter what mode of operation the MOSFET employs (i.e., enhancement mode or depletion mode), under some circumstances, when a MOSFET is operated in an off-state with a nonzero gate bias voltage applied with respect to the source and drain, an accumulated charge may occur under the gate. When the MOSFET is in an off-state, and when carriers are present in the channel region having a polarity that is opposite the polarity of the source and drain carriers, the MOSFET is defined herein as operating in the accumulated charge regime.

Note that the accumulated charge does not accumulate in the body in an instant as soon as the FET transitions from an on-state (conducting state) to an off-state (non-conducting state). Rather, when the FET transitions from the on-state to the off-state, it begins to accumulate charge in the body of the MOSFET, and the amount of accumulated charge increases over time. The accumulation of the accumulated charge therefore has an associated time constant (i.e., it does not instantly reach a steady-state level of accumulated charge). The accumulated charge accumulates slowly in the FET body. The depleted FET has a $C_{off}$ associated with it which is increased with an increasing amount of accumulated charge. In terms of FET performance, as the $C_{off}$ increases with an increasing amount of accumulated charge in the FET body, drift occurs in the FET insertion loss (i.e., the FET becomes more "lossy"), isolation (the FET becomes less isolating), and insertion phase (delay in the FET is increased). Reducing, removing, or otherwise controlling the accumulated charge also mitigates these undesirable drift effects.

Methods and apparatuses for improving semiconductor device linearity (e.g., reducing adverse harmonic distortion and IMD effects) in SOI MOSFETs are described below in more detail. In one exemplary embodiment, the method and apparatus improves the linearity and controls the harmonic distortion and IMD effects of the MOSFET devices by reducing the accumulated charge in the bodies of the MOSFET devices. The accumulated charge in the MOSFET bodies is controlled or removed using an accumulated charge sink (ACS) that is operatively coupled to the MOSFET body. In one embodiment, the present method and apparatus entirely removes all of the accumulated charge from the bodies of the MOSFET devices. In one described embodiment, the MOSFET is biased to operate in an accumulated charge regime, and the ACS is used to entirely remove, reduce, or otherwise control the accumulated charge and thereby reduce harmonic distortions and IMD that would otherwise result. Linearity is also improved in some embodiments by removing or otherwise controlling the accumulated charge thereby improving floating body MOSFET BVDSS characteristics.

It is noted that persons skilled in the electronic device design and manufacture arts shall appreciate that the teachings herein apply equally to MOSFETs fabricated on Semiconductor-On-Sapphire (SOS) substrates as well as SOI substrates. The present teachings can be used in the implementation of MOSFETs using any convenient semiconductor-on-insulator technology. For example, the MOSFETs described herein can be implemented using compound semiconductors fabricated on insulating substrates, such as GaAs MESFETs. The present method and apparatus may also be applied to silicon-germanium (SiGe) SOI MOSFETs. For simplicity, many examples presented herein for illustrative purposes include only NMOSFETs, unless otherwise noted. By making well known changes to dopants, charge carriers, polarity of bias voltages, etc., persons skilled in the electronic device design arts will easily understand how these embodiments and examples may be adapted for use with PMOSFETs.

Figures 28A, 28B:
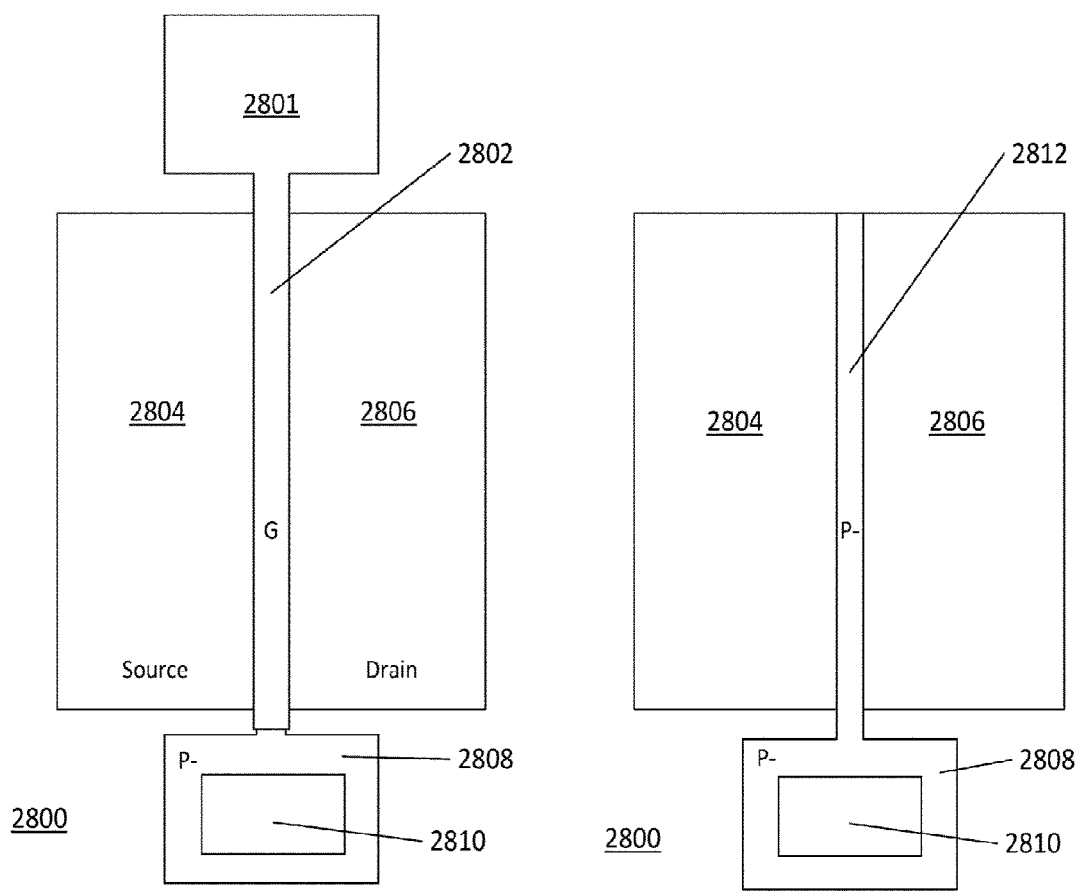
FIGS. 28A and 28B are simplified schematic diagrams of a top view of an SOI NMOSFET adapted to control accumulated charge.

FIGS. 28A and 28B are simplified schematic diagrams of a top view of an Accumulated Charge Control (ACC) SOI NMOSFET 2800 adapted to control accumulated charge 2620 of FIG. 26. In the exemplary embodiment, a gate contact 2801 is coupled to a first end of a gate 2802. A gate oxide (not shown in FIG. 28A but shown in FIG. 26) and a body 2812 (shown in FIG. 28B) are positioned under the gate 2802. In the exemplary NMOSFET 2800 shown, a source 2804 and a drain 2806 comprise N+ regions. In the exemplary embodiment, the ACC NMOSFET 2800 includes an accumulated charge sink (ACS) 2808 comprising a P− region. The ACS 2808 is coupled to and is in electrical communication with the body 2812 which also comprises a P− region. An electrical contact region 2810 provides electrical connection to the ACS 2808. In some embodiments, the electrical contact region 2810 comprises a P+ region. As shown in FIG. 28A, the electrical contact region 2810 is coupled to and is in electrical communication with the ACS 2808.

In one example, the ACS 2808 operates effectively to remove or otherwise control the accumulated charge from the SOI NMOSFET 2800 using a high impedance connection to and throughout the body 2812. High impedance ACS's may be used because the accumulated charge 2620 is primarily generated by phenomena (e.g., thermal generation) that take a relatively long period of time to produce significant accumulated charge. For example, a typical time period for producing non-negligible accumulated charge when the NMOSFET operates in the accumulated charge regime is approximately a few milliseconds or greater. Such relatively slow generation of accumulated charge corresponds to very low currents, typically less than 100 nA/mm of transistor width. Such low currents can be effectively conveyed even using very high impedance connections to the body. According to one example, the ACS 2808 is implemented with a connection having a resistance of greater than $10^6 \Omega$. Consequently, the ACS 2808 is capable of effectively removing or otherwise controlling the accumulated charge 2620 even when implemented with a relatively high impedance connection, relative to the low impedance body contacts.

Those skilled in the arts of electronic devices shall understand that the electrical contact region 2810 may be used to facilitate electrical coupling to the ACS 2808 because in some embodiments it may be difficult to make a direct contact to a lightly doped region. In addition, in some embodiments the ACS 2808 and the electrical contact region

2810 may be coextensive. In another embodiment, the electrical contact region 2810 comprises an N+ region. In this embodiment, the electrical contact region 2810 functions as a diode connection to the ACS 2808, which prevents positive current flow into the ACS 2808 (and also prevents positive current flow into the body 2812) under particular bias conditions, as described below in more detail.

FIG. 28B is an alternative top view of the ACC SOI NMOSFET 2800 of FIG. 28A, illustrating the ACC NMOSFET 2800 without its gate contact 2801, gate 2802, and gate oxide being visible. This view allows the body 2812 to be visible. FIG. 28B shows the coupling of the ACS 2808 to one end of the body 2812. In one embodiment, the body 2812 and the ACS 2808 comprise a combined P− region that may be produced by a single ion-implantation step. In another embodiment, the body 2812 and ACS 2808 comprise separate P− regions that are coupled together.

As is well known to those skilled in the electronic device design arts, in other embodiments, the ACC NMOSFET 2800 of FIGS. 28A and 28B can be implemented as an ACC PMOSFET simply by reversing the dopant materials used to implement the various FET component regions (i.e., replace p-type dopant material with n-type dopant material, and vice versa). More specifically, in an ACC PMOSFET, the source and drain comprise P+ regions, and the body comprises an N− region. In this embodiment, the ACS 2808 also comprises an N− region. In some embodiments of the ACC PMOSFET, the electrical contact region 2810 may comprise an N+ region. In other embodiments of the ACC PMOSFETs, the region 2810 comprises a P+ region, which functions as a diode connection to the ACS 2808 and thereby prevents current flow into the ACS 2808 under particular bias conditions.

As previously mentioned, applications such as RF switch circuits may use SOI MOSFETs operated with off-state bias voltages, for which accumulated charge may result. The SOI MOSFETs are defined herein as operating within the accumulated charge regime when the MOSFETs are biased in the off-state, and when carriers having opposite polarity to the channel carriers are present in the channel regions of the MOSFETs. In some embodiments, the SOI MOSFETs may operate within the accumulated charge regime when the MOSFETs are partially depleted yet still biased to operate in the off-state. Significant benefits in improving nonlinear effects on source-drain capacitance can be realized by removing or otherwise controlling the accumulated charge according to the present teachings.

Figure 28C:
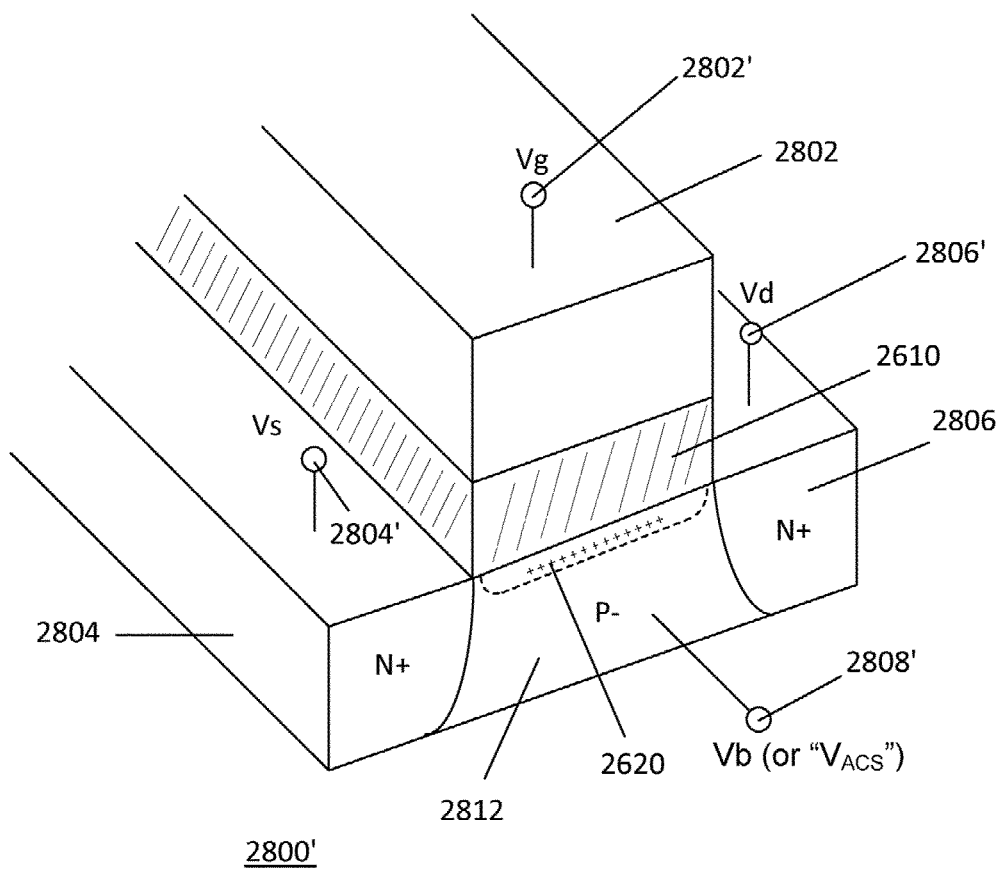
FIG. 28C is a cross-sectional perspective schematic of an SOI NMOSFET adapted to control accumulated charge showing gate, source, drain, and accumulated charge sink (ACS) terminals.

FIG. 28C is a cross-sectional perspective schematic of an ACC SOI NMOSFET 2800' adapted to control accumulated charge in accordance with the disclosed method and apparatus. In the example shown in FIG. 28C, the ACC NMOSFET 2800' includes four terminals that provide electrical connection to the various FET component regions. In one embodiment, the terminals provide means for connecting external integrated circuit (IC) elements (such as metal leads, not shown) to the various FET component regions. For example, as shown in FIG. 28C, the ACC NMOSFET 2800' includes a gate terminal 2802' that provides electrical connection to the gate 2802. Similarly, the ACC NMOSFET 2800' includes source 2804' and drain 2806' terminals that provide electrical connection to the source 2804 and drain 2806, respectively. As is well known in the electronic design arts, the terminals are coupled to their respective FET component regions (i.e., gate, drain, and source) via so-called "ohmic" (i.e., low resistance) contact regions. The manufacturing and structural details associated with the coupling of the various FET terminal to the FET component regions are well known in the art, and therefore are not described in more detail.

As described above with reference to FIGS. 28A and 28B, the ACC NMOSFET 2800' is adapted to control accumulated charge when the NMOSFET operates in the accumulated charge regime. To this end, in the exemplary implementation shown in FIG. 28C, the ACC NMOSFET 2800' includes a fourth terminal that provides electrical connection to the body 2812, and thereby facilitates reduction (or other control) of the accumulated charge when the FET 2800' operates in the accumulated charge regime. More specifically, and referring again to FIG. 28C, the ACC NMOSFET includes a "body" terminal, or Accumulated Charge Sink (ACS) terminal 2808'. The ACS terminal 2808' provides an electrical connection to the ACS 2808 (not shown in FIG. 28C, but shown in FIGS. 28A and 28B) and to the body 2812. Although the ACS terminal 2808' is shown in FIG. 28C as being physically coupled to the body 2812, those skilled in the electronic design arts shall understand that this depiction is for illustrative purposes only. The direct coupling of the ACS terminal 2808' to the body 2812 shown in FIG. 28C illustrates the electrical connectivity (i.e., not the physical coupling) of the terminal 2808' with the body 2812. Similarly, the other terminals (i.e., terminals (2802', 2804', and 2806')) are also shown in FIG. 28C as being physically coupled to their respective FET component regions. These depictions are also for illustrative purposes only.

In accordance with the disclosed method and apparatus, when the ACC NMOSFET 2800' is biased to operate in the accumulated charge regime (i.e., when the ACC NMOSFET 2800' is in the off-state, and there is an accumulated charge 2620 of P polarity (i.e., holes) present in the channel region of the body 2812), the accumulated charge is removed or otherwise controlled via the ACS terminal 2808'. When accumulated charge 2620 is present in the body 2812, the charge 2620 can be removed or otherwise controlled by applying a bias voltage ($V_b$ (for "body") or $V_{ACS}$ (ACS bias voltage)) to the ACS terminal 2808'. In general, the ACS bias voltage $V_{ACS}$ applied to the ACS terminal 2808' may be selected to be equal to or more negative than the lesser of the source bias voltage Vs and drain bias voltage Vd. More specifically, in some embodiments, the ACS terminal 2808' can be coupled to various accumulated charge sinking mechanisms that remove (or "sink") the accumulated charge when the FET operates in the accumulated charge regime. Several exemplary accumulated charge sinking mechanisms and circuit configurations are possible.

Figure 29A:
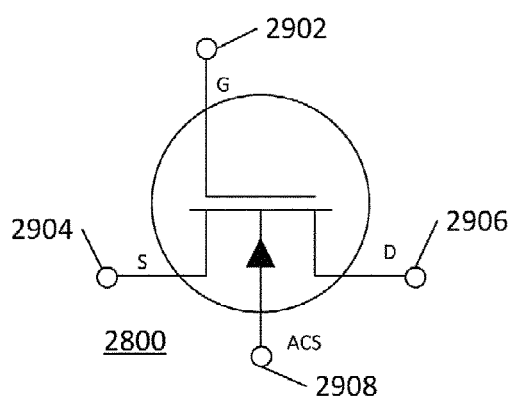
FIG. 29A is a simplified schematic of an SOI NMOSFET adapted to control accumulated charge embodied as a four terminal device.

The SOI NMOSFET 2800 of FIGS. 28A and 28B may be implemented as a four terminal device, as illustrated schematically in FIG. 29A. As shown in the ACC SOI NMOSFET 2800 of FIG. 29A, a gate terminal 2902 is electrically coupled to the gate contact 2801 (e.g., FIG. 28A) and is analogous to the gate terminal 2802' shown in FIG. 28C. The gate contact 2801 is electrically coupled to the gate 2802 (e.g., FIGS. 28A and 28C). Similarly, a source terminal 2904 is electrically coupled to the source 2804 (e.g., FIGS. 28A-28C) and is analogous to the source terminal 2804' of FIG. 28C. Similarly, a drain terminal 2906 is electrically coupled to the drain 2806 (e.g., FIGS. 28A-28C) and is analogous to the drain terminal 2806' of FIG. 28C. Finally, the ACC NMOSFET 2800 includes an ACS terminal 2908 that is electrically coupled to the ACS 2808 (e.g., see FIGS. 28A-28B) via the region 2810. Those skilled in the electronic design and manufacturing arts will understand that the region 2810 may be used in some embodiments to facilitate electrical coupling to the ACS 2808 because, in some embodiments, it may be difficult to make a direct contact to a lightly doped region (i.e., the ACS 2808). The ACS terminal 2908 is analogous to the ACS terminal 2808 shown in FIG. 28C.

Figure 29B:
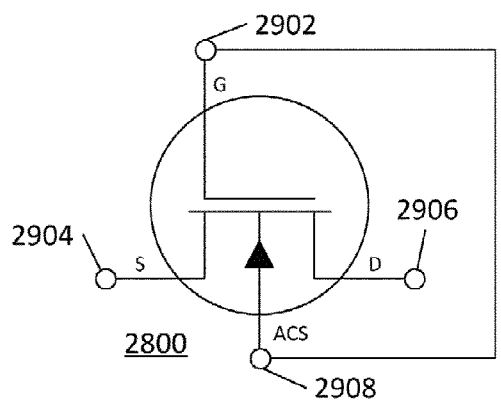
FIG. 29B is a simplified schematic of an SOI NMOSFET adapted to control accumulated charge, embodied as a four terminal device, where an accumulated charge sink (ACS) terminal is coupled to a gate terminal.

The ACC SOI NMOSFET 2800 of FIG. 29A may be operated using various techniques and implemented in various circuits in order to control accumulated charge present in the FET when it is operating in an accumulated charge regime. For example, in one exemplary embodiment as shown in FIG. 29B, the gate 2902 and ACS 2908 terminals are electrically coupled together. In one embodiment of the simplified circuit shown in FIG. 29B, the source and drain bias voltages applied to the terminals 2904 and 2906, respectively, may be zero. If the gate bias voltage Vg applied to the gate terminal 2902 is sufficiently negative with respect to the source and drain bias voltages applied to the terminals 2904 and 2906, and with respect to the threshold voltage $V_{th}$, (e.g., if $V_{th}$ is approximately zero, and if Vg is more negative than approximately −1 V), the ACC NMOSFET 2800 operates in the accumulated charge regime. As described above with reference to FIG. 28C, for example, when the MOSFET operates in this regime, accumulated charge (holes) may accumulate in the body of the NMOSFET 2800.

The accumulated charge can be removed via the ACS terminal 2908 by connecting the ACS terminal 2908 to the gate terminal 2902 as shown. This configuration ensures that when the FET 2800 is in the off-state, it is held in the correct bias region to effectively remove or otherwise control the accumulated charge. As shown in FIG. 29B, connecting the ACS terminal 2908 to the gate ensures that the same bias voltages are applied to both the gate (Vg) and the body (shown in FIG. 28C as "Vb" or "$V_{ACS}$"). Because the bias voltage $V_{ACS}$ is the same as the gate voltage Vg in this embodiment, the accumulated charge is no longer trapped below the gate oxide (by attraction to the gate bias Vg) because it is conveyed to the gate terminal 2902 via the ACS terminal 2908. The accumulated charge is thereby removed from the body via the ACS terminal 2908.

Figure 29C:
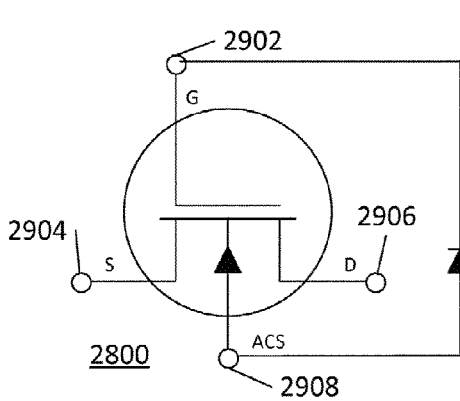
FIG. 29C is a simplified schematic of an SOI NMOSFET adapted to control accumulated charge, embodied as a four terminal device, where an accumulated charge sink (ACS) terminal is coupled to a gate terminal via a diode.

Another exemplary simplified circuit using the improved ACC SOI NMOSFET 2800 is shown in FIG. 29C. As shown in FIG. 29C, in this embodiment, the ACS terminal 2908 may be electrically coupled to a diode 2910, and the diode 2910 may, in turn, be coupled to the gate terminal 2902. This embodiment may be used to prevent a positive current flow into the MOSFET body 2812 caused by a positive Vg-to-Vs (or, equivalently, Vgs, where Vgs=Vg−Vs) bias voltage, as may occur, for example, when the SOI NMOSFET 2800 is biased into an on-state condition. With the exception of the diode 2910 used to prevent the flow of positive current into the ACS terminal 2908, exemplary operation of the simplified circuit shown in FIG. 29C is the same as the operation of the circuit as described above with reference to FIG. 29B.

In some exemplary embodiments, as described with reference to FIG. 28C, for example, Vs and Vd may comprise nonzero bias voltages. According to these examples, Vg must be sufficiently negative with respect to both Vs and Vd in order for Vg to be sufficiently negative to $V_{th}$ to turn the NMOSFET 2800 off (i.e., operate the NMOSFET 2800 in the off-state). When so biased, the NMOSFET 2800 may enter the accumulated charge regime and thereby have accumulated charge present in the body. For this example, the voltage $V_{ACS}$ may also be selected to be equal to Vg by connecting the ACS terminal 2908 to the gate terminal 2902, thereby conveying the accumulated charge from the body of the ACC NMOSFET.

In another embodiment, the ACC NMOSFET 2800 comprises a depletion mode device. In this embodiment, the threshold voltage $V_{th}$ is, by definition, less than zero. For Vs and Vd both at zero volts, when a gate bias Vg sufficiently negative to $V_{th}$ is applied to the gate terminal 2902 (for example, Vg more negative than approximately −1 V relative to $V_{th}$), holes may accumulate under the gate oxide and thereby comprise an accumulated charge. For this example, the voltage $V_{ACS}$ may also be selected to be equal to Vg by connecting the ACS terminal 2908 to the gate terminal 2902, thereby conveying the accumulated charge from the ACC NMOSFET as described above.

Figure 29D:
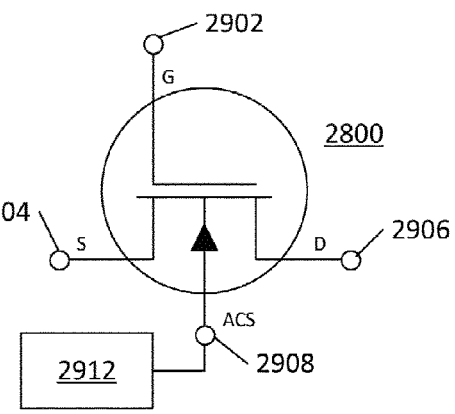
FIG. 29D is a simplified schematic of an SOI NMOSFET adapted to control accumulated charge, embodied as a four terminal device, where an accumulated charge sink (ACS) terminal is coupled to a control circuit.

In another embodiment, the ACS terminal 2908 may be coupled to a control circuit 2912 as illustrated in the simplified circuit of FIG. 29D. The control circuit 2912 may provide a selectable ACS bias voltage $V_{ACS}$ that selectively controls the accumulated charge (i.e., the accumulated charge 2620 described above with reference to FIG. 26). As shown in FIG. 29D, rather than having a local circuit provide the ACS bias voltage $V_{ACS}$ (e.g., as derived from the gate voltage Vg), in some implementations the ACS bias voltage $V_{ACS}$ is produced by a separate source that is independent of the ACC MOSFET device 2800. In the case of a switch, the ACS bias voltage $V_{ACS}$ should be driven from a source having a high output impedance. For example, such a high output impedance source can be obtained using a large series resistor in order to ensure that the RF voltage is divided across the MOSFET and that the ACS bias voltage $V_{ACS}$ has Vds/2 "riding" on it, similarly to the gate voltage.

It may be desirable to provide a negative ACS bias voltage $V_{ACS}$ to the ACS terminal 2908 when the SOI NMOSFET 2800 is biased into an accumulated charge regime. In this exemplary embodiment, a control circuit 2912 (as shown in FIG. 29D) may prevent positive current flow into the ACS terminal 2908 by selectively maintaining an ACS bias voltage $V_{ACS}$ that is consistently negative with respect to both the source and drain bias voltages. In particular, the control circuit 2912 may be used to apply an ACS bias voltage that is equal to or more negative than the lesser of Vs and Vd. By application of such an ACS bias voltage, the accumulated charge is thereby removed or otherwise controlled.

Other Embodiments

Figure 30:
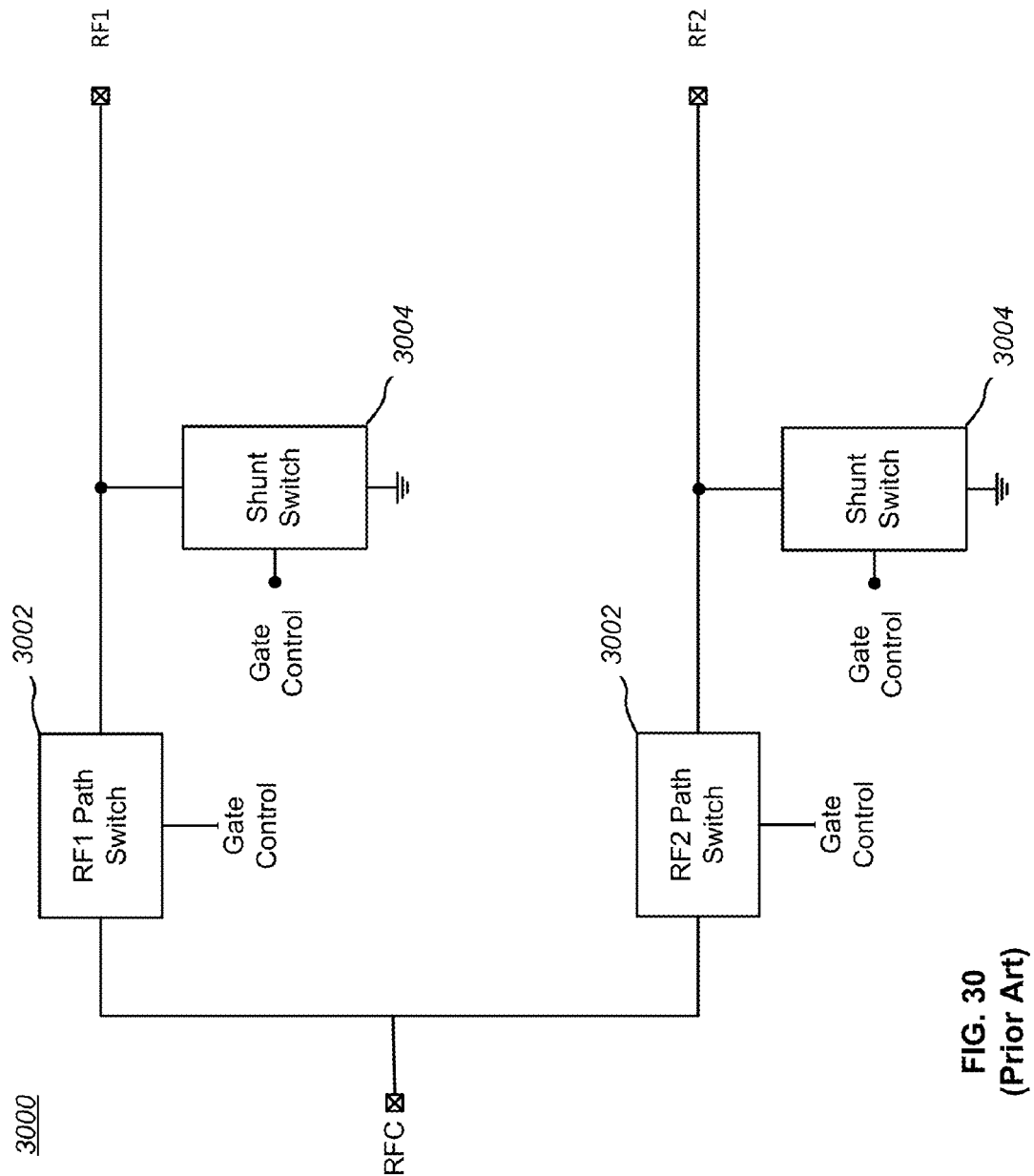
FIG. 30 is a block diagram of a prior art radio frequency (RF) switch.

Another aspect of self-activating adjustable power limiters is usage in combination with series switch components in a switch circuit in lieu of conventional shunt switches. By way of background, FIG. 30 is a block diagram of a prior art radio frequency (RF) switch 3000. A common port RFC may be coupled to a selected one of a plurality of terminal ports (two are shown, RF1 and RF2) through a corresponding RF signal path switch 3002, each coupled to an associated Gate Control signal. In order to further isolate off-state RF signal paths from an on-state path, each signal path includes a shunt switch 3004 coupled to a corresponding Gate Control signal. Each shunt switch 3004 may be selectively activated to couple a corresponding terminal port to circuit ground. In order to activate a selected signal path (e.g., to couple RFC to RF1), the Gate Control signal associated with the signal path switch 3002 for the selected signal path is set to "ON" (conducting), and all other signal path switches 3002 are set to "OFF" (blocking). Concurrently, the shunt switch 3004 associated with the selected signal path is set to "OFF" (blocking), while the shunt switches 3004 associated with the non-selected signal paths are set to "ON" (conducting), thereby shunting the non-selected terminal ports to circuit ground.

Embodiments of the present invention may advantageously utilize self-activating adjustable power limiters in lieu of conventional shunt switches in such a switch circuit.

Figure 31:
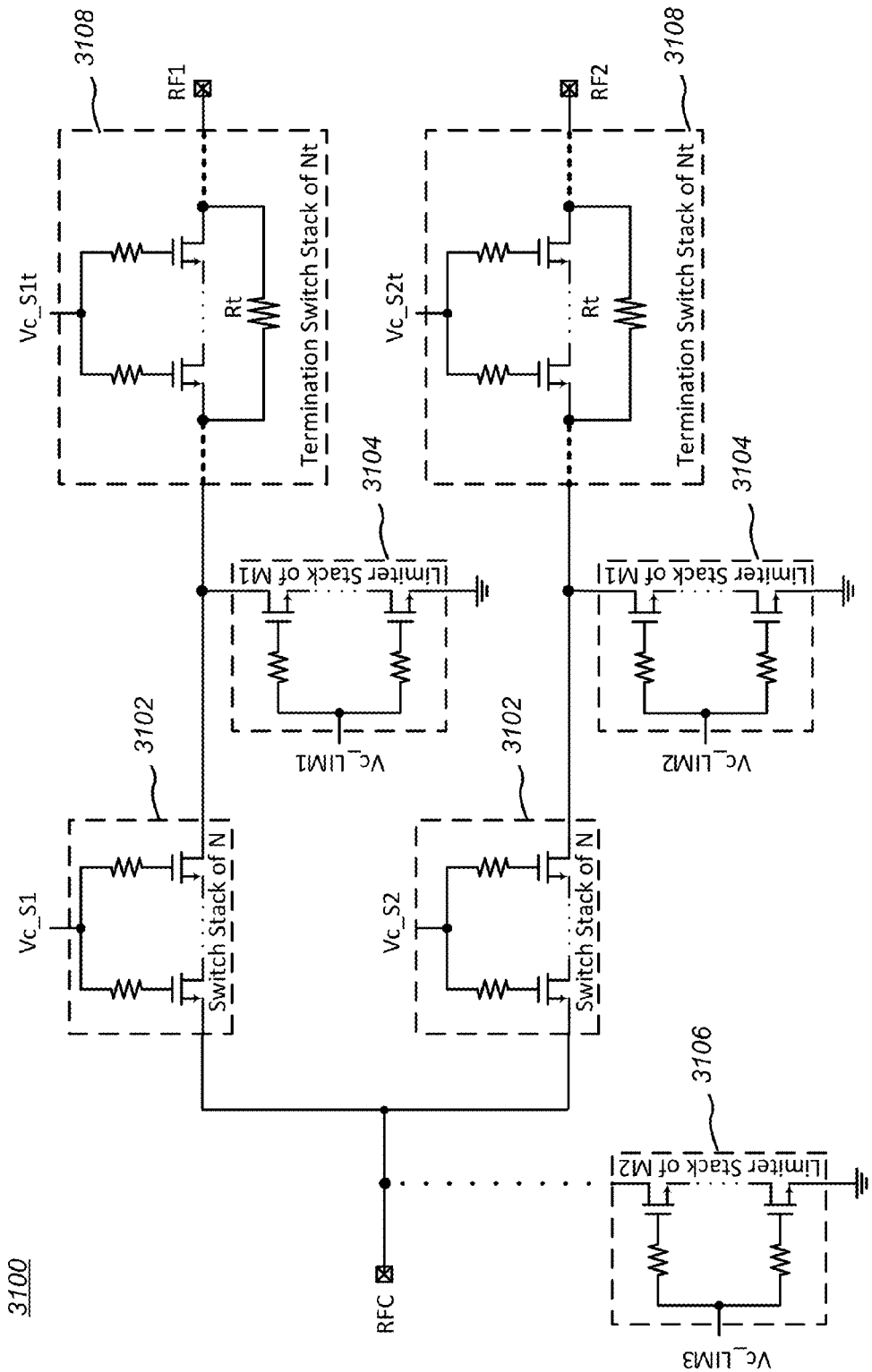
FIG. 31 is a schematic diagram of an RF switch that includes series switch components and self-activating adjustable power limiters between a common port and an associated terminal port.

For example, FIG. 31 is a schematic diagram of an RF switch 3100 that includes signal path circuitry comprising series switch elements 3102 and corresponding self-activating adjustable power limiters 3104 between a common port RFC and associated terminal ports RF1, RF2; the switch 3100 may also be characterized as a "single pole, double throw" (SPDT) switch. Only two terminal ports RF1, RF2 are illustrated; however, the same circuitry can be replicated in order to add additional terminal ports. In addition, in some applications, a single terminal port may be coupled to the common port RFC, as in the case of a single pole, single throw (SPST) switch.

In the illustrated embodiment, each power limiter 3104 comprises a stack of M1 limiting elements, shown as FETs in this example, coupled in a shunt configuration between circuit ground and an associated terminal port RF1, RF2. The stacked FET's are similar to those shown in FIG. 22B (note that the associated capacitive structures illustrated in FIG. 22B are not shown for clarity). Each power limiter 3104 has an associated control signal, Vc_LIM1, Vc_LIM2. In applications where a single limiting element can handle voltages that might occur during operation, a single limiting element may be used (i.e., M1=1).

The series switch elements 3102 in the illustrated embodiment comprise a stack of N switching elements, shown as FETs in this example; however, other switch devices may be used (e.g., MEMS switches). Each series switch element 3102 is controlled by an associated control signal Vc_S1, Vc_S2. The control signal voltage and the stack size are empirically determined for each application so as to ensure that the series switch elements 3102 are fully ON or OFF in light of anticipated incoming signal amplitudes. In applications where a single limiting element can handle voltages that might occur during operation, a single switch element may be used for each terminal port branch (i.e., N=1).

In order to activate a selected signal path (e.g., to couple RFC to RF1), the control signal associated with the series switch element 3102 for the selected signal path is set to "ON" (conducting), and all other series switch element 3102 are set to "OFF" (blocking), effectively uncoupling their associated terminal ports (e.g., RF2) from the common port RFC. The power limiter 3104 for the selected signal path is configured to operate as described above to limit power that might occur at the associated selected active terminal port (e.g., RF1) while signals are conducted from the common port RFC to the selected terminal port. However, the power limiters 3104 for the non-selected (inactive) signal paths are repurposed to behave as shunts by setting their associated control signals to force those power limiters 3104 to be "ON" (conducting), thereby shunting the non-selected terminal ports to circuit ground.

Accordingly, by replacing conventional shunt switches 3004 (see FIG. 30) with self-activating adjustable power limiters 3104, the illustrated RF switch 3100 provides the same functionality as a prior art switch when a signal path is inactivated, but with the added benefit of power limiting at each terminal port when a signal path is activated.

The embodiment shown in FIG. 31 assumes a signal direction from the common port RFC to a terminal port (e.g., RF1, RF2). To limit leakage power at the common port RFC in applications where the signal may be in the other direction, or if the signal direction is unknown, a power limiter 3106 optionally may be coupled to the common port RFC as shown by the dotted line connection in FIG. 31. The common port power limiter 3106 is controlled by an associated control signal Vc_S3 and is shown as having a stack height of M2, which may be the same as or different from the stack height M1 for the terminal port power limiters 3104. In applications where a single limiting element can handle voltages that might occur during operation, a single limiting element may be used (i.e., M2=1).

Solid state switches are typically categorized as absorptive (or terminated) or reflective. By convention, absorptive switches incorporate a 50 ohm termination in each of the terminal ports to present a low voltage standing wave ratio (VSWR) in both the OFF and ON states. Reflective switches reflect RF power in terminal ports that are in an OFF state. For the embodiments described so far for the switch 3100 shown in FIG. 31, the switch architecture has been reflective. For a terminated port embodiment, each terminal port signal path of the switch 3100 may include an optional termination component 3108. In the illustrated embodiment, the termination component 3108 is shown as an absorptive series component of the type taught in co-pending and commonly assigned U.S. patent application Ser. No. 14/527, 168, filed on Oct. 29, 2014, entitled High Frequency Absorptive Switch Architecture, the disclosure of which is incorporated herein by reference. However, a conventional shunt type termination circuit may also be used.

In the illustrated embodiment, each termination component 3108 is connected between a corresponding terminal port and power limiter 3104, and includes a resistor $R_T$ coupled in parallel with one or more switches, such as a stack of Nt FET switches. The ON or OFF state of each termination component 3108 is set by a corresponding control signal Vc_S1t, Vc_S2t. The combination of the resistor $R_T$ and the switch stack is placed in series with a corresponding signal path from each terminal port (e.g., RF1, RF2) through a corresponding series switch element 3102 to the common terminal RFC, rather than in a shunt configuration; the optional inclusion of the termination component 3108 is depicted by dotted line connections in FIG. 31. In some integrated circuit embodiments, the $R_T$ resistance may be located off-chip in order to be sufficiently capable of dissipating heat when absorbing RF power injected at the coupled terminal port.

When the common port RFC is to be coupled to terminal port RF1 (for example), the switch stack of the associated termination component 3108 and the series switch element 3102 for the selected signal path are set to "ON" (conducting), allowing signal transmission between the common port RFC and the terminal port RF1. In this mode of operation, the parallel combination of the switch stack resistance ($R_{on}$) and the resistor $R_T$ of the termination component 3108 looks like two resistors in parallel: $R_{on} \| R_T$. For RF applications, since insertion loss is critical, $R_{on}$ is set to be much less than the system characteristic impedance.

In the converse state, when terminal port RF1 is to be isolated from the common port RFC (i.e., an "OFF" state for the RF1 signal path), the corresponding signal path series switch element 3102 is set to "OFF" (blocking) and the associated power limiter 3104 is set to "ON" (conducting). In addition, the switch stack of the associated termination component 3108 is set to "OFF" (blocking). In this mode of operation, the switch stack of the termination component 3108 has the characteristics of a capacitor (with value $C_{off}$) rather than a resistor (with value $R_{on}$). Thus, the parallel combination of the switch stack capacitance $C_{off}$ and the resistor $R_T$ looks like a parallel RC circuit: $C_{off} \| R_T$. Notably, the associated power limiter 3104, which has been forced to a conductive state, shunts any RF signal present on the terminal port RF1 to ground through $R_T$ of the termination component 3108.

One advantage of the illustrated termination component 3108 is that the parallel combination of the termination resistor $R_T$ and the resistance Ron of the switch stack begins to look more capacitive as frequency is increased. This is a beneficial behavior because the impedance to circuit ground of the shunt switches begins to look more inductive as frequency is increased. These two reactive impedances, when added in series, substantially cancel each other and the result remains more nearly a real impedance close to a targeted characteristic impedance. Another advantage is that terminated RF power can be more consistently and completely terminated in the $R_T$ resistor and not in the switch stack of the termination component 3108, and power is also dissipated across the power limiter 3104 connected in series with each termination component 3108.

Figure 32:
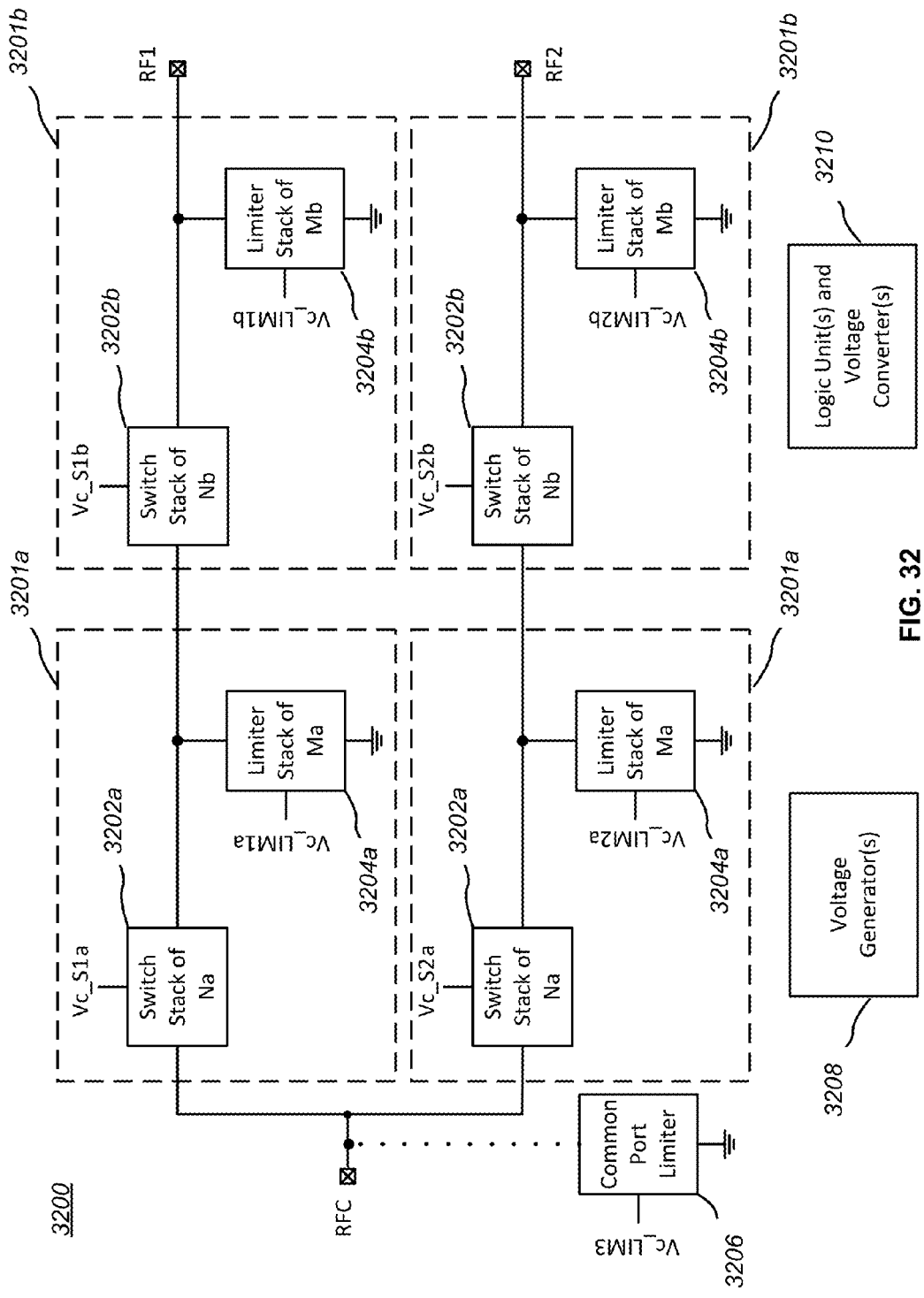
FIG. 32 is a block diagram showing an embodiment of a switch having switching paths that include multiple stages of series switches and self-activating adjustable power limiters.

FIG. 32 is a block diagram showing an embodiment of a switch 3200 having signal paths that include multiple stages of series switches and self-activating adjustable power limiters. In the illustrated embodiment, two stages 3201a, 3201b are shown in each of two signal paths (i.e., RF1 to RFC, and RF2 to RFC), but the concept extends to additional signal paths and additional stages within each signal path, as well as to a single signal path (as in a SPST switch).

Each stage 3201a, 3201b includes a series switch 3202a, 3202b and a corresponding self-activating adjustable power limiter 3204a, 3204b, in both cases of the corresponding types shown in greater detail in FIG. 31. The series switches 3202a, 3202b may be of different stack heights within each stage (e.g., Na or Nb) to allow for different power and/or voltage handling characteristics; as noted above, in some applications the stack height may be "one" (e.g., a single FET). Each series switch 3202a, 3202b is coupled to an associated control signal, shown as Vc_S1a, Vc_S1b, Vc_S2a, and Vc_S2b in this example. The self-activating adjustable power limiters 3204a, 3204b may also be of different stack heights within each stage (e.g., Ma or Mb) to allow for different power and/or voltage handling characteristics; again, in some applications the stack height may be "one" (e.g., a single FET). Each power limiter 3204a, 3204b is coupled to an associated control signal, shown as Vc_LIM1a, Vc_LIM1ab, Vc_LIM2a, and Vc_LIM2b in this example.

By utilizing two or more stages of series switches and self-activating adjustable power limiters, power limiters 3204a, 3204b with different thresholds and flat leakage characteristics can be combined. Such an arrangement can enable the power limiters to handle higher power and lower the flat leakage power to the terminal ports (RF1 and RF2 in this example). As an example, in the switch 3200 shown in FIG. 32, one set of stages 3201a in each signal path may be configured such that the corresponding power limiters 3204a have a high limiting threshold, while the other set of stages 3201b in the same signal path may be configured such that the corresponding power limiters 3204b have a low limiting threshold.

Also shown in FIG. 32 is an optional common port limiter 3206 having a control signal Vc_LIM3, which may be configured like the power limiter 3106 of FIG. 31. The common port limiter 3206 protects the common port RFC if the signal direction is from RF1 or RF2 to RFC, and is also useful if the signal direction is unknown.

Further, as in the embodiment shown in FIG. 31, optional termination components 3108 (not shown in FIG. 32) can be included at each terminal port RF1, RF2.

An implementation of the switch 3200, particularly as an integrated circuit "chip", may include one or more voltage generators 3208 for generating internal bias voltages (positive and/or negative) for all components, and one or more logic units and voltage converters 3210 for receiving and processing external logic signals and providing control signals for the series switches 3202a, 3202b and power limiters 3204a, 3204b, 3206 according to a desired state of operation, in known fashion. By way of example, the voltage generators 3208 may be implemented in accordance with the teachings of co-pending and commonly assigned U.S. patent application Ser. No. 13/932,996, filed on Jul. 1, 2013, entitled Differential Charge Pump, and/or U.S. patent application Ser. No. 13/933,006, filed on Jul. 1, 2013, entitled Variable Frequency Charge Pump, and issued as U.S. Pat. No. 9,264,053, the disclosures of which are incorporated herein by reference.

Embodiments of the invention in accordance with the teachings of FIG. 31 and FIG. 32 are particularly useful in applications that may involve unexpected peak input/output voltage or power levels, since the power limiters provide for fast protection against over-voltage or over-power conditions. For example, embodiments of the switch 3100, 3200 could be useful in high power switches with poor VSWR conditions. High power series switch elements would handle the high power mode, but do not protect adjacent stages. However, by including an associated power limiter, the power limiter would be activated in an over-power condition to protect adjacent stages (for example, if an antenna is disconnected from a port, resulting in an un-matched situation and poor VSWR), providing important functionality not available with a simple shunt switch configuration.

Another aspect of the invention includes a method for implementing a switch, including: providing a common port; providing at least one terminal port; and providing signal path circuitry coupled to the common port and to an associated one terminal port, the signal path circuitry including a series switch and an associated self-activating power limiter.

Another aspect of the invention includes a method for implementing a switch, including: providing a common port; providing at least one terminal port; providing signal path circuitry coupled to the common port and to an associated one terminal port, the signal path circuitry including a series switch and an associated self-activating power limiter; operating the self-activating power limiter in a limiting mode when the common port is to be electrically coupled to the associated one terminal port, and operating the self-activating power limiter in a shunt mode when the common port is to be electrically uncoupled from the associated one terminal port.

For clarity, the term "self-activating power limiter" includes a device or devices (such as a stack of individual devices) having an adjustable limiting threshold, each device including:

at least one switching element, each having a control input, a signal input, and an output;

each switching element having a first coupling element electrically connected from the signal input of such switching element to the control input of such switching element;

each switching element having a second coupling element electrically connected from the control input of such switching element to the output of such switching element; and at least one control voltage source electrically coupled to the control inputs of the at least one switching element to adjustably control the limiting threshold of the limiter.

The coupling elements referenced above include capacitive coupling elements. Further, each switching element may be in a non-conductive state while the signal input is below a selected level determined by the limiting threshold, and in a controlled variable impedance state while the signal input is above a selected level determined by the limiting threshold, the signal input being limited while the switching element is in the controlled variable impedance state. Other forms of self-activating power limiters are defined by the claims of U.S. patent application Ser. No. 13/841,490, entitled "Self-Activating Adjustable Power Limiter", filed on Mar. 13, 2013, and issued as U.S. Pat. No. 8,928,388, the entire disclosure of which has been incorporated herein by reference.

A number of embodiments of the invention have been described. It is to be understood that various modifications may be made without departing from the spirit and scope of the invention. It is to be understood that the foregoing description is intended to illustrate and not to limit the scope of the invention, which is defined by the scope of the following claims, and that other embodiments are within the scope of the claims.

What is claimed is:

1. A switch including:
(a) a common port;
(b) at least one terminal port; and
(c) a first stage of signal path circuitry coupled to the common port and to an associated one of the at least one terminal port, the signal path circuitry including a series switch and an associated self-activating power limiter including at least one limiting element having an input coupled to the common port, the input configured to receive an input signal having a voltage, the at least one limiting element further including a control input configured to receive a control voltage, the control voltage adjustably controlling a limiting threshold of the at least one limiting element,
wherein the at least one limiting element is in a non-conductive state while the voltage of the input signal is below a selected level determined by the limiting threshold, and in a controlled variable impedance state while the input signal is above a selected level determined by the limiting threshold, the input signal being limited while the at least one limiting element is in the controlled variable impedance state.

2. The switch of claim 1, wherein each terminal port is coupled to corresponding signal path circuitry.

3. The switch of claim 1, wherein the series switch includes a stack of switching elements.

4. The switch of claim 1, wherein the at least one limiting element of the self-activating power limiter includes a stack of limiting elements.

5. The switch of claim 1, further including a termination component coupled between the associated one terminal port and the associated self-activating power limiter.

6. The switch of claim 5, wherein the termination component includes a stack of switches.

7. The switch of claim 1, wherein the self-activating power limiter is connected to the associated one terminal port in a shunt configuration.

8. The switch of claim 7, wherein the self-activating power limiter is forced to be in a shunt mode when the associated one terminal port is inactivated.

9. The switch of claim 1, further including at least one additional stage of signal path circuitry coupled between the first stage of signal path circuitry and the associated one terminal port.

10. The switch of claim 1, wherein the switch is embodied within an integrated circuit.

11. A method for implementing a switch, including:
(a) providing a common port;
(b) applying an input signal having a voltage to the common port;
(c) providing at least one terminal port; and
(d) providing a first stage of signal path circuitry coupled to the common port and to an associated one of the at least one terminal port, the signal path circuitry including a series switch and an associated self-activating power limiter including at least one limiting element having an input coupled to the common port,
(e) applying a control voltage to a control input of the least one limiting element, the control voltage adjustably controlling a limiting threshold of the at least one limiting element to place the at least one limiting element in a non-conductive state while the voltage of the input signal is below a selected level determined by the limiting threshold, and to place the limiting element in a controlled variable impedance state while the voltage of the input signal is above a selected level determined by the limiting threshold, the voltage of the input signal being limited while the at least one limiting element is in the controlled variable impedance state.

12. The method of claim 11, wherein each terminal port is coupled to corresponding signal path circuitry.

13. The method of claim 11, wherein the series switch includes a stack of switching elements.

14. The method of claim 11, wherein the at least one limiting element of the self-activating power limiter includes a stack of limiting elements.

15. The method of claim 11, further including providing a termination component coupled between the associated one terminal port and the associated self-activating power limiter.

16. The method of claim 15, wherein the termination component includes a stack of switches.

17. The method of claim 11, wherein the self-activating power limiter is connected to the associated one terminal port in a shunt configuration.

18. The method of claim 17, wherein the self-activating power limiter is forced to be in a shunt mode when the associated one terminal port is inactivated.

19. The method of claim 11, further including providing at least one additional stage of signal path circuitry coupled between the first stage of signal path circuitry and the associated one terminal port.

20. The method of claim 11, further including embodying the switch within an integrated circuit.

21. The method of claim 11, further including operating the self-activating power limiter in a limiting mode when the common port is to be electrically coupled to the associated one terminal port, and operating the self-activating power limiter in a shunt mode when the common port is to be electrically uncoupled from the associated one terminal port.

22. A switch including:
(a) a common port;
(b) at least one terminal port; and
(c) a first stage of signal path circuitry coupled to the common port and to an associated one of the at least one terminal port, the signal path circuitry including series switch means for selectively coupling the common port to the associated one terminal port, and an associated self-activating power limiter means for selectively either coupling the terminal port to ground or limiting power between the associated one terminal port and the series switch means, the associated self-activating power means including at least one limiting element having an input coupled to the common port, the input configured to receive an input signal having a voltage, the at least one limiting element further including a control input configured to receive a control voltage, the control voltage adjustably controlling a limiting threshold of the at least one limiting element, wherein the at least one limiting element is in a non-conductive state while the voltage of the input signal is below a selected level determined by the limiting threshold, and in a controlled variable impedance state while the input signal is above a selected level determined by the limiting threshold, the input signal being limited while the at least one limiting element is in the controlled variable impedance state.

23. The switch of claim 22, wherein each terminal port is coupled to corresponding signal path circuitry.

24. The switch of claim 22, wherein the series switch means includes a stack of switching elements.

25. The switch of claim 22, wherein the at least one limiting element of the self-activating power limiter means includes a stack of limiting elements.

26. The switch of claim 22, further including a termination component means coupled between the associated one terminal port and the associated self-activating power limiter, for electrically terminating the associated one terminal port when the common port is to be electrically uncoupled from the associated one terminal port.

27. The switch of claim 26, wherein the termination component means includes a stack of switches.

28. The switch of claim 22, wherein the self-activating power limiter means is connected to the associated one terminal port in a shunt configuration.

29. The switch of claim 22, wherein the self-activating power limiter means is forced to be in a shunt mode when the associated one terminal port is inactivated.

30. The switch of claim 22, further including at least one additional stage of signal path circuitry coupled between the first stage of signal path circuitry and the associated one terminal port.

31. The switch of claim 22, wherein the switch is embodied within an integrated circuit.

32. A switch including:
(a) a common port;
(b) at least one terminal port; and
(c) a first stage of signal path circuitry coupled to the common port and to an associated one of the at least one terminal port, the signal path circuitry including a series switch comprising a stack of switching elements and an associated self-activating power limiter comprising a stack of limiting elements each having an input coupled to the common port, the input configured to receive an input signal having a voltage, the stack of limiting elements further including a control input configured to receive a control voltage, the control voltage adjustably controlling a limiting threshold of the stack of limiting elements, wherein the stack of limiting elements is in a non-conductive state while the voltage of the input signal is below a selected level determined by the limiting threshold, and in a controlled variable impedance state while the input signal is above a selected level determined by the limiting threshold, the input signal being limited while the stack of limiting elements is in the controlled variable impedance state.

33. The switch of claim 32, further including at least one additional stage of signal path circuitry coupled between the first stage of signal path circuitry and the associated one terminal port.

34. The switch of claim any one of claims 4, 14, 22 and 32, wherein the limiting elements include field effect transistors.

* * * * *